US012777981B2

(12) United States Patent
Wang et al.

(10) Patent No.: US 12,777,981 B2
(45) Date of Patent: Oct. 27, 2026

(54) RING STRUCTURE SURROUNDING A PACKAGE COMPONENT

(71) Applicant: Taiwan Semiconductor Manufacturing Company, Ltd., Hsinchu (TW)

(72) Inventors: Chin-Hua Wang, New Taipei City (TW); Shu-Shen Yeh, Taoyuan City (TW); Po-Chen Lai, Hsinchu County (TW); Po-Yao Lin, Zhudong Township, Hsinchu County (TW); Shin-Puu Jeng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 375 days.

(21) Appl. No.: 18/490,855

(22) Filed: Oct. 20, 2023

(65) Prior Publication Data

US 2024/0047441 A1 Feb. 8, 2024

Related U.S. Application Data

(63) Continuation of application No. 17/460,705, filed on Aug. 30, 2021, now Pat. No. 11,830,859.

(51) Int. Cl.

| | |
|---|---|
| ***H10W 90/00*** | (2026.01) |
| ***H10W 42/00*** | (2026.01) |
| ***H10W 76/01*** | (2026.01) |
| ***H10W 76/12*** | (2026.01) |
| ***H10W 76/40*** | (2026.01) |
| ***H10W 76/60*** | (2026.01) |

(52) U.S. Cl.

CPC ......... *H10W 90/00* (2026.01); *H10W 42/121* (2026.01); *H10W 76/01* (2026.01); *H10W 76/12* (2026.01); *H10W 76/60* (2026.01); *H10W 76/40* (2026.01)

(58) Field of Classification Search

CPC ..... H01L 21/4817; H01L 23/04; H01L 23/10; H01L 23/562; H01L 23/16; H01L 25/162; H01L 25/165; H10W 90/00; H10W 76/01; H10W 76/12; H10W 76/60; H10W 42/121

See application file for complete search history.

(56) References Cited

U.S. PATENT DOCUMENTS

| | | | | |
|---|---|---|---|---|
| 8,008,133 B2 * | 8/2011 | Tosaya | H01L 23/04 | 438/126 |
| 8,921,994 B2 | 12/2014 | Higgins, III | | |
| 10,325,830 B1 | 6/2019 | Arvin | | |
| 11,587,887 B2 * | 2/2023 | Lin | H01L 23/5386 | |
| 11,646,302 B2 * | 5/2023 | Chen | H01L 23/04 | 257/680 |

(Continued)

*Primary Examiner* — Alonzo Chambliss

(74) *Attorney, Agent, or Firm* — McClure, Qualey & Rodack, LLP

(57) ABSTRACT

A package structure is provided. The package structure includes a first package component and a second package component. The second package component includes a substrate and the first package component is mounted to the substrate. The package structure includes a ring structure disposed on the second package component and around the first package component. The ring structure has a first foot and a second foot parallel to the first foot. The width of the first foot is greater than the width of the second foot.

20 Claims, 26 Drawing Sheets

(56) References Cited

U.S. PATENT DOCUMENTS

| | | | | |
|---|---|---|---|---|
| 11,728,233 | B2 * | 8/2023 | Yeh | H01L 23/24 257/734 |
| 11,830,859 | B2 * | 11/2023 | Wang | H01L 23/562 |
| 12,183,714 | B2 * | 12/2024 | Wang | H01L 24/73 |
| 2007/0152326 | A1 | 7/2007 | Lim | |
| 2007/0158823 | A1 | 7/2007 | Dani | |
| 2008/0099910 | A1 | 5/2008 | McLellan | |
| 2009/0200659 | A1 | 8/2009 | Tosaya | |
| 2010/0044100 | A1 | 2/2010 | Ono | |
| 2010/0149410 | A1 | 6/2010 | Matsuzawa | |
| 2010/0319981 | A1 | 12/2010 | Kapusta | |
| 2014/0252634 | A1 | 9/2014 | Hung | |
| 2015/0001701 | A1 | 1/2015 | Li | |
| 2015/0194362 | A1 | 7/2015 | Otremba | |
| 2016/0035637 | A1 * | 2/2016 | Urago | H01L 23/053 257/693 |
| 2016/0233141 | A1 * | 8/2016 | Hirobe | H01L 23/3675 |
| 2016/0343672 | A1 | 11/2016 | Yang | |
| 2017/0012007 | A1 | 1/2017 | Chung | |
| 2018/0114734 | A1 | 4/2018 | Wang | |
| 2018/0190601 | A1 | 7/2018 | Hitomi | |
| 2018/0342466 | A1 | 11/2018 | Lin | |
| 2019/0122999 | A1 | 4/2019 | Hung | |
| 2021/0378106 | A1 * | 12/2021 | Iyengar | H01L 24/83 |
| 2022/0223542 | A1 | 7/2022 | Lin | |
| 2022/0359465 | A1 | 11/2022 | Wang | |

* cited by examiner

300

RING STRUCTURE SURROUNDING A PACKAGE COMPONENT

PRIORITY CLAIM AND CROSS-REFERENCE

This application is a Continuation of U.S. patent application Ser. No. 17/460,705, filed Aug. 30, 2021, and entitled "PACKAGE STRUCTURES AND METHOD FOR FORMING THE SAME", now U.S. Pat. No. 11,830,859, the entirety of which is incorporated by reference herein.

BACKGROUND

The semiconductor industry has experienced rapid growth due to ongoing improvements in the integration density of a variety of electronic components (e.g., transistors, diodes, resistors, capacitors, etc.). For the most part, improvements in integration density have resulted from iterative reductions of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

Although existing package structures have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
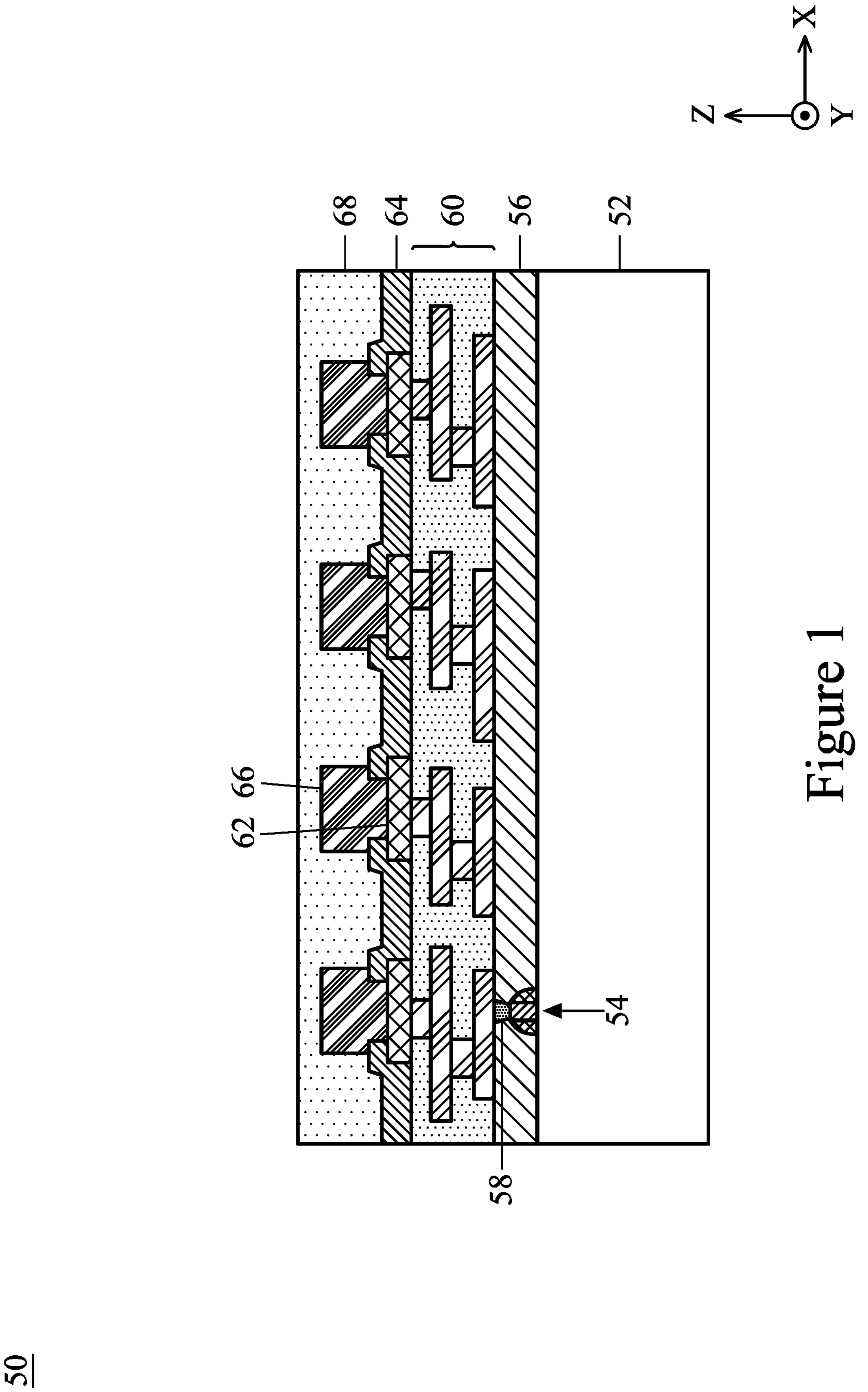
FIG. 1 illustrates a cross-sectional view of an integrated circuit die in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Embodiments of packages structures are provided. The packages structure includes a ring structure disposed on the substrate and covering the electronic component on the substrate. The ring structure is configured to protect the electronic component and/or reduce the warpage of the package structure. For example, the ring structure includes a first foot and a second foot which are located on a single side of the first package component. The footprints of the first foot and the second foot are controlled and adjusted in various forms to reduce the warpage of the package structure. In addition, the electronic component is contained in a recess between the first foot and the second foot for preventing damage. The electronic component is separated from the first foot and the second foot to make the assembly of the package structure easier.

FIG. 1 illustrates a cross-sectional view of an integrated circuit die 50 in accordance with some embodiments. The integrated circuit die 50 will be packaged in subsequent processing to form an integrated circuit package. In some embodiments, the integrated circuit die 50 includes a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof.

In some embodiments, the integrated circuit die 50 is formed in a wafer, which may include different device regions that are singulated in subsequent steps to form a plurality of integrated circuit dies. In some embodiments, the integrated circuit die 50 is processed according to applicable manufacturing processes to form integrated circuits. For example, the integrated circuit die 50 includes a semiconductor substrate 52, such as silicon, doped or undoped, or an active layer of a semiconductor-on-insulator (SOI) substrate. In some embodiments, the semiconductor substrate 52 includes other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 52 has an active surface (e.g., the surface facing upwards in FIG. 1), sometimes called a front side and an inactive surface (e.g., the surface facing downwards in FIG. 1), sometimes called a back side.

In some embodiments, devices (represented by a transistor) 54 are formed at the front side of the semiconductor substrate 52. In some embodiments, the devices 54 are active devices (e.g., transistors, diodes, etc.), capacitors, resistors, etc. An inter-layer dielectric (ILD) 56 is over the front side of the semiconductor substrate 52. In some embodiments, the ILD 56 surrounds and may cover the devices 54. In some embodiments, the ILD 56 includes one or more dielectric layers formed of materials such as Phospho-Silicate Glass (PSG), Boro-Silicate Glass (BSG), Boron-Doped Phospho-Silicate Glass (BPSG), undoped Silicate Glass (USG), or the like.

In some embodiments, conductive plugs 58 extend through the ILD 56 to electrically and physically couple the devices 54. For example, when the devices 54 are transistors, the conductive plugs 58 may couple the gates and source/drain regions of the transistors. In some embodiments, the conductive plugs 58 is formed of tungsten, cobalt, nickel, copper, silver, gold, aluminum, the like, or combinations thereof. An interconnect structure 60 is over the ILD 56 and conductive plugs 58. The interconnect structure 60 interconnects the devices 54 to form an integrated circuit. In some embodiments, the interconnect structure 60 is formed by, for example, metallization patterns in dielectric layers on the ILD 56. The metallization patterns include metal lines and vias formed in one or more low-k dielectric layers. The metallization patterns of the interconnect structure 60 are electrically coupled to the devices 54 by the conductive plugs 58.

The integrated circuit die 50 further includes pads 62, such as aluminum pads, to which external connections are made. The pads 62 are on the active side of the integrated circuit die 50, such as in and/or on the interconnect structure 60. One or more passivation films 64 are on the integrated circuit die 50, such as on portions of the interconnect structure 60 and pads 62. Openings extend through the passivation films 64 to the pads 62. Die connectors 66, such as conductive pillars (for example, formed of a metal such as copper), extend through the openings in the passivation films 64 and are physically and electrically coupled to respective ones of the pads 62. In some embodiments, the die connectors 66 are formed by, for example, plating, or the like. The die connectors 66 electrically couple the respective integrated circuits of the integrated circuit die 50.

Optionally, solder regions (e.g., solder balls or solder bumps) may be disposed on the pads 62. In some embodiments, the solder balls are used to perform chip probe (CP) testing on the integrated circuit die 50. In some embodiments, the CP testing is performed on the integrated circuit die 50 to ascertain whether the integrated circuit die 50 is a known good die (KGD). Thus, only integrated circuit dies 50, which are KGDs, undergo subsequent processing and are packaged, and dies, which fail the CP testing, are not packaged. After testing, the solder regions may be removed in subsequent processing steps.

A dielectric layer 68 may (or may not) be on the active side of the integrated circuit die 50, such as on the passivation films 64 and the die connectors 66. Initially, in some embodiments, the dielectric layer 68 may bury the die connectors 66, such that the topmost surface of the dielectric layer 68 is above the topmost surfaces of the die connectors 66. In some embodiments where solder regions are disposed on the die connectors 66, the dielectric layer 68 may bury the solder regions as well.

In some embodiments, the dielectric layer 68 includes a polymer such as polybenzoxazole (PBO), polyimide, benzocyclobutene (BCB), or the like; a nitride such as silicon nitride or the like; an oxide such as silicon oxide, phosphosilicate glass (PSG), borosilicate glass (BSG), boron-doped phosphosilicate glass (BPSG), or the like; the like, or a combination thereof. In some embodiments, the dielectric layer 68 is formed, for example, by spin coating, lamination, chemical vapor deposition (CVD), or the like.

In some embodiments, the integrated circuit die 50 is a stacked device that includes multiple semiconductor substrates 52. For example, the integrated circuit die 50 may be a memory device such as a hybrid memory cube (HMC) module, a high bandwidth memory (HBM) module, or the like that includes multiple memory dies. In such embodiments, the integrated circuit die 50 includes multiple semiconductor substrates 52 interconnected by through-substrate vias (TSVs). Each of the semiconductor substrates 52 may (or may not) have an interconnect structure 60.

FIGS. 2 through 15 illustrate cross-sectional views of intermediate steps during a process for forming a first package component 100, in accordance with some embodiments. In some embodiments, one or more of the integrated circuit dies 50 are packaged to form an integrated circuit package. In some embodiments, the integrated circuit packages may also be referred to as integrated fan-out (InFO) packages. However, the present disclosure is not limited thereto. It should be noted that a plurality of first package components 100 may be formed in a wafer and singulated in the processes. For the sake of clarity and simplicity, one first package component 100 is shown in the present disclosure.

Figure 2:
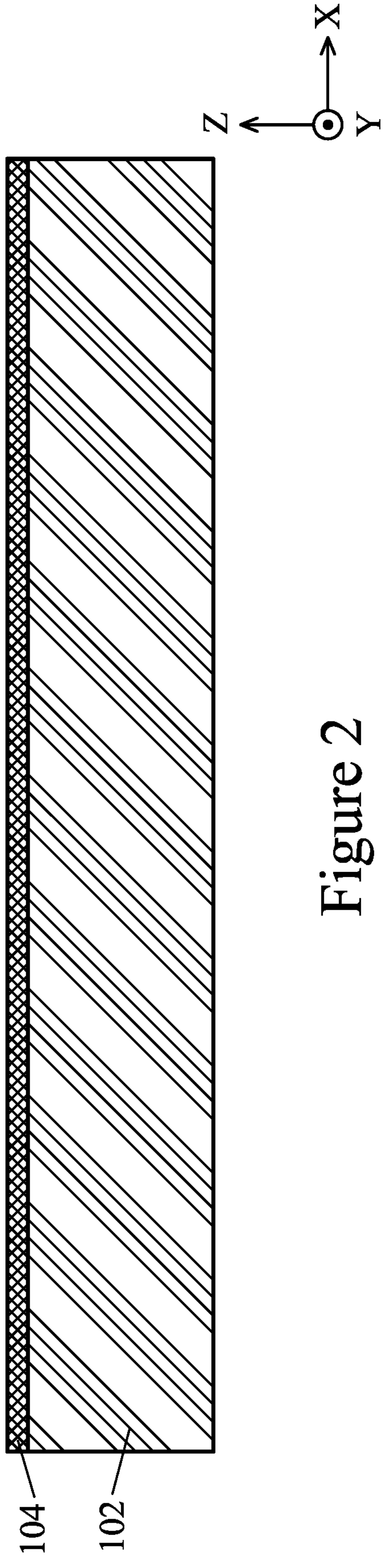
FIGS. 2 through 15 illustrate cross-sectional views of intermediate steps during a process for forming a package component in accordance with some embodiments.

In FIG. 2, a carrier substrate 102 is provided, and a release layer 104 is formed on the carrier substrate 102. The carrier substrate 102 may be a glass carrier substrate, a ceramic carrier substrate, or the like. In some embodiments, the carrier substrate 102 includes a wafer, such that multiple packages can be formed on the carrier substrate 102 simultaneously.

In some embodiments, the release layer 104 is formed of a polymer-based material, which may be removed along with the carrier substrate 102 from the overlying structures that will be formed in subsequent steps. In some embodiments, the release layer 104 is an epoxy-based thermal-release material, which loses its adhesive property when heated, such as a light-to-heat-conversion (LTHC) release coating. In other embodiments, the release layer 104 may be an ultra-violet (UV) glue, which loses its adhesive property when exposed to UV lights. In some embodiments, the release layer 104 may be dispensed as a liquid and cured, may be a laminate film laminated onto the carrier substrate 102, or may be the like. In some embodiments, the top surface of the release layer 104 is leveled and has a high degree of planarity.

In FIGS. 3 through 7, a redistribution structure 120 (see FIG. 7) is formed over the release layer 104. In some embodiments, the metallization patterns may also be referred to as redistribution layers or redistribution lines. The redistribution structure 120 is shown as an example having four layers of metallization patterns. More or fewer dielectric layers and metallization patterns may be formed in the redistribution structure 120. If fewer dielectric layers and metallization patterns are to be formed, steps and process discussed below may be omitted. If more dielectric layers and metallization patterns are to be formed, steps and processes discussed below may be repeated.

Figure 3:
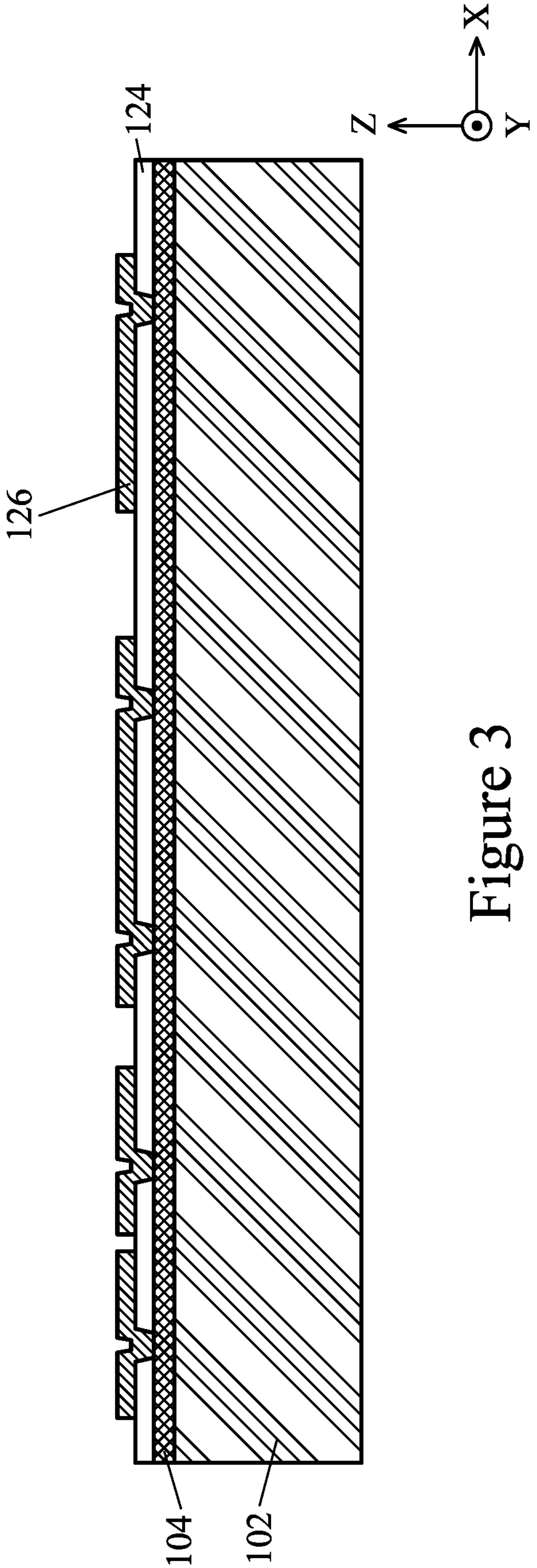

In FIG. 3, the dielectric layer 124 is deposited on the release layer 104. In some embodiments, the dielectric layer 124 is formed of a photo-sensitive material such as PBO, polyimide, BCB, or the like, which may be patterned using a lithography mask. In some embodiments, the dielectric layer 124 is formed by spin coating, lamination, CVD, the like, or a combination thereof. The dielectric layer 124 is then patterned. The patterning forms openings exposing portions of the release layer 104. In some embodiments, the patterning may be performed by an acceptable process, such as by exposing and developing the dielectric layer 124 to light when the dielectric layer 124 is a photo-sensitive material or by etching using, for example, an anisotropic etch.

The metallization pattern 126 is then formed. The metallization pattern 126 includes conductive elements extending along the major surface of the dielectric layer 124 and extending through the dielectric layer 124. As an example to form the metallization pattern 126, a seed layer is formed over the dielectric layer 124 and in the openings extending through the dielectric layer 124. In some embodiments, the seed layer is a metal layer, which may be a single layer or a composite layer comprising a plurality of sub-layers formed of different materials. In some embodiments, the seed layer comprises a titanium layer and a copper layer over the titanium layer. In some embodiments, the seed layer is formed using, for example, physical vapor deposition (PVD) or the like. A photoresist is then formed and patterned on the seed layer. In some embodiments, the photoresist is formed by spin coating or the like and may be exposed to light for patterning. The pattern of the photoresist corresponds to the metallization pattern 126. The patterning forms openings through the photoresist to expose the seed layer. A conductive material is then formed in the openings of the photoresist and on the exposed portions of the seed layer. In some embodiments, the conductive material is formed by plating, such as electroplating or electroless plating, or the like. In some embodiments, the conductive material includes a metal, like copper, titanium, tungsten, aluminum, or the like. The combination of the conductive material and underlying portions of the seed layer form the metallization pattern 126. The photoresist and portions of the seed layer on which the conductive material is not formed are removed. In some embodiments, the photoresist is removed by an acceptable ashing or stripping process, such as using an oxygen plasma or the like. Once the photoresist is removed, exposed portions of the seed layer are removed, such as by using an acceptable etching process, such as by wet or dry etching.

Figure 4:
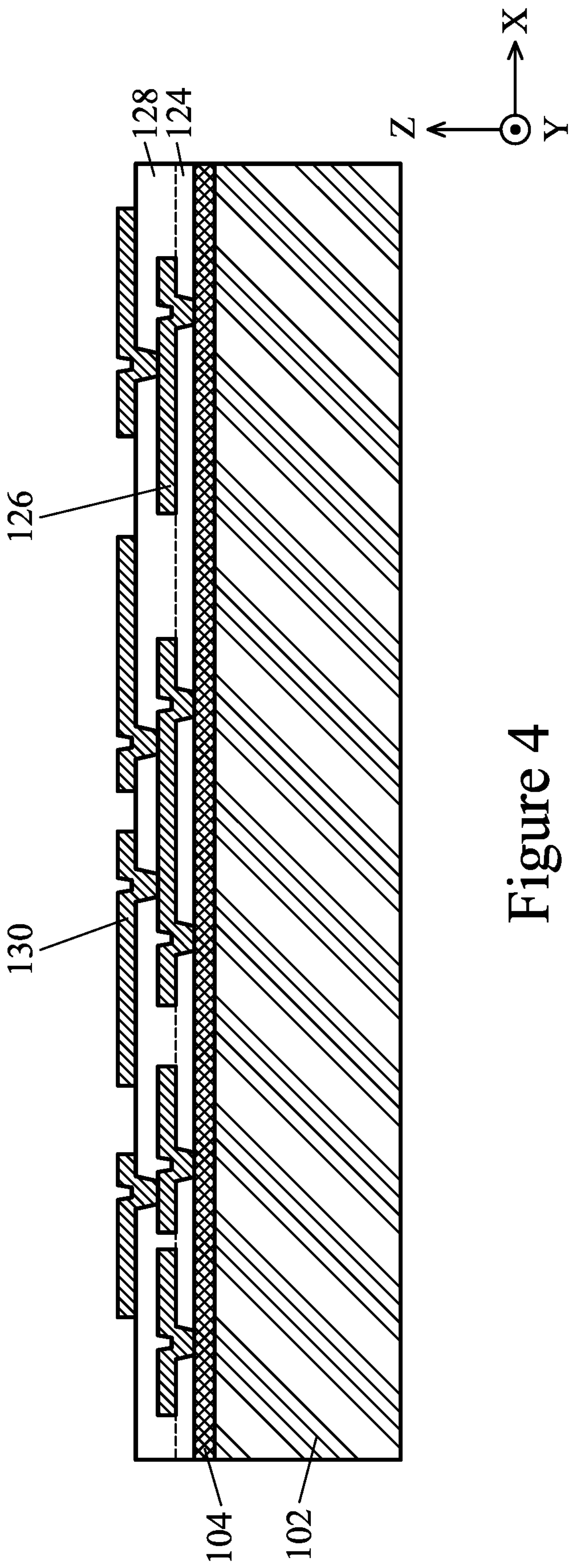

In FIG. 4, the dielectric layer 128 is deposited on the metallization pattern 126 and the dielectric layer 124. In some embodiments, the dielectric layer 128 is formed in a manner similar to the dielectric layer 124, and is formed of a similar material as the dielectric layer 124.

The metallization pattern 130 is then formed. The metallization pattern 130 includes portions on and extending along the major surface of the dielectric layer 128. The metallization pattern 130 further includes portions extending through the dielectric layer 128 to physically and electrically couple the metallization pattern 126. In some embodiments, the metallization pattern 130 is formed in a similar manner and of a similar material as the metallization pattern 126. In some embodiments, the metallization pattern 130 has a different size than the metallization pattern 126. For example, the conductive lines and/or vias of the metallization pattern 130 may be wider or thicker than the conductive lines and/or vias of the metallization pattern 126. Furthermore, in some embodiments, the metallization pattern 130 is formed to a greater pitch than the metallization pattern 126.

Figure 5:
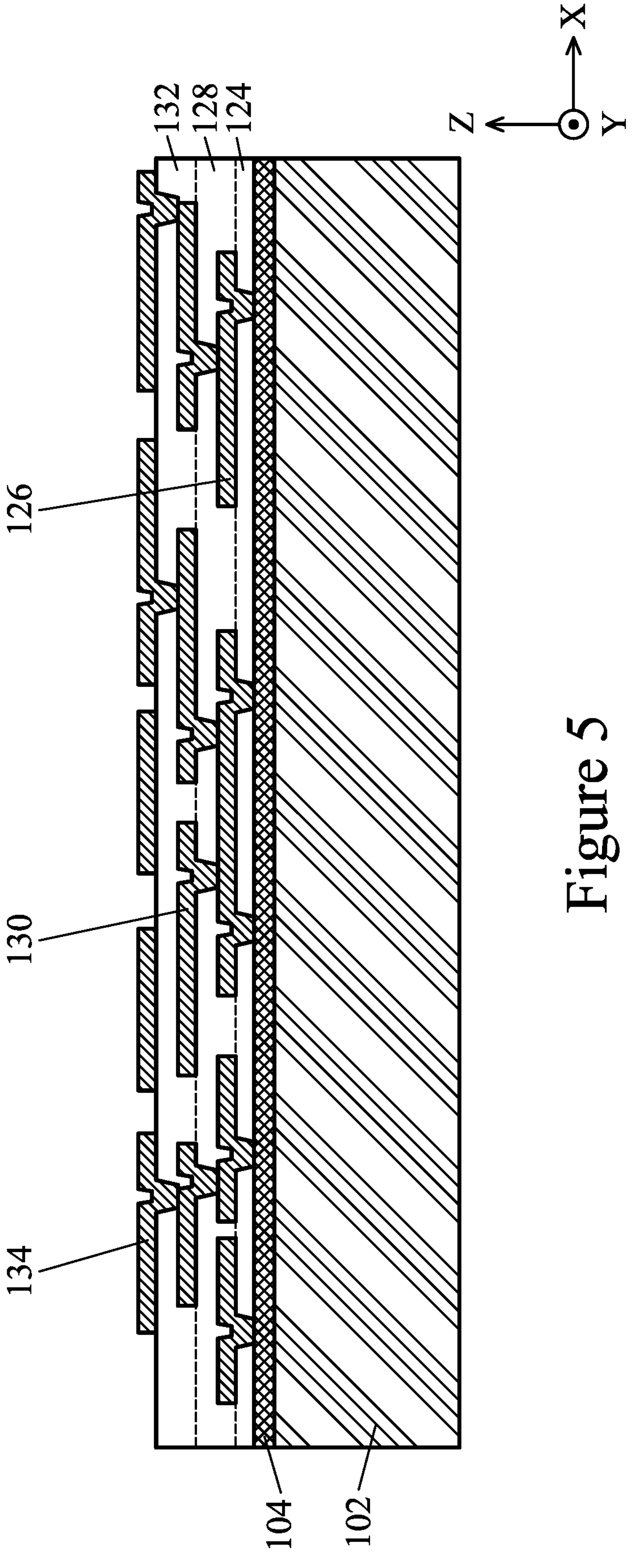

In FIG. 5, the dielectric layer 132 is deposited on the metallization pattern 130 and the dielectric layer 128. In some embodiments, the dielectric layer 132 is formed in a manner similar to the dielectric layer 124, and is formed of a similar material as the dielectric layer 124.

The metallization pattern 134 is then formed. The metallization pattern 134 includes portions on and extending along the major surface of the dielectric layer 132. The metallization pattern 134 further includes portions extending through the dielectric layer 132 to physically and electrically couple the metallization pattern 130. In some embodiments, the metallization pattern 134 is formed in a similar manner and of a similar material as the metallization pattern 126. In some embodiments, the metallization pattern 134 has a different size than the metallization patterns 126 and 130. For example, the conductive lines and/or vias of the metallization pattern 134 may be wider or thicker than the conductive lines and/or vias of the metallization patterns 126 and 130. Furthermore, in some embodiments, the metallization pattern 134 is formed to a greater pitch than the metallization pattern 130.

Figure 6:
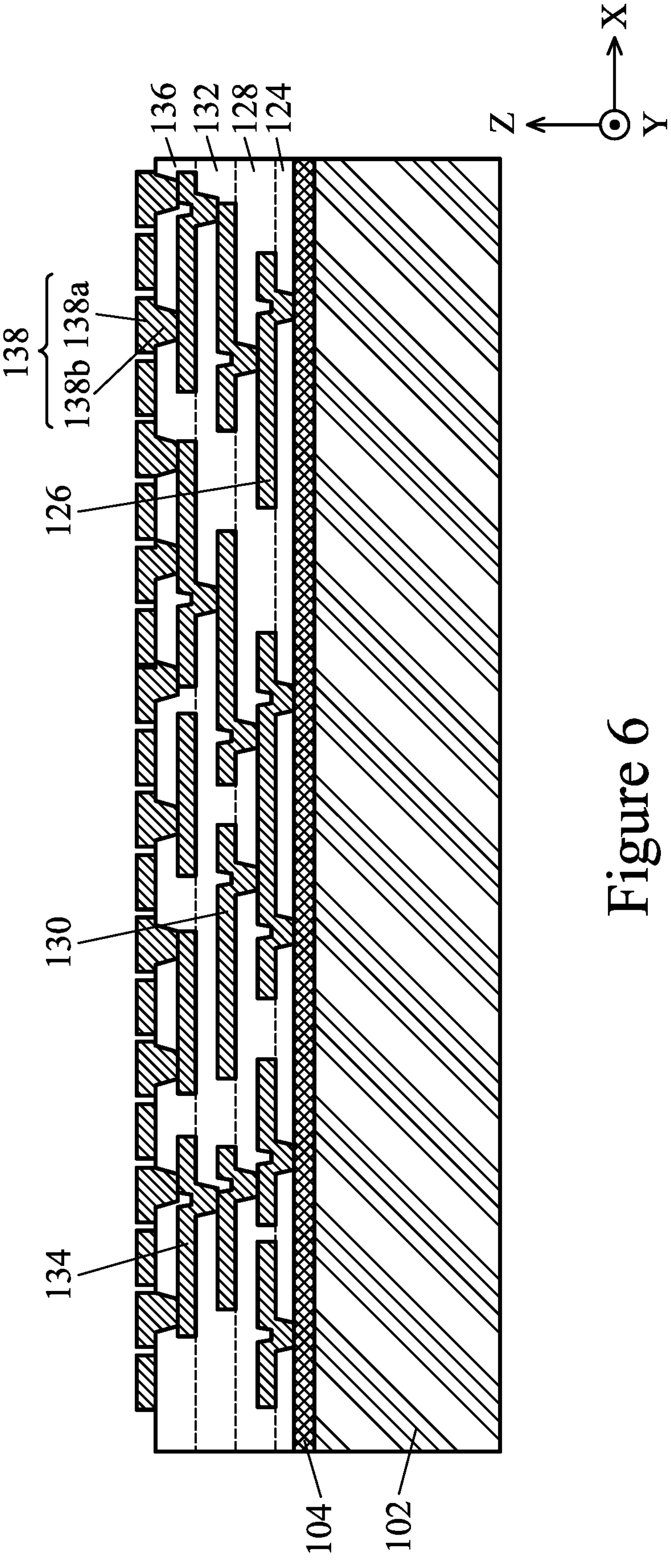

In FIG. 6, the dielectric layer 136 is deposited on the metallization pattern 134 and the dielectric layer 132. In some embodiments, the dielectric layer 136 is formed in a manner similar to the dielectric layer 124, and is formed of a similar material as the dielectric layer 124.

The metallization pattern 138 is then formed. In some embodiments, the metallization pattern 138 includes portions **138*a* on and extending along the major surface of the dielectric layer 132. The metallization pattern 138 further includes portions 138*b* extending through the dielectric layer 136 to physically and electrically couple the metallization pattern 134. In some embodiments, the metallization pattern 138 is formed in a similar manner and of a similar material as the metallization pattern 126. The metallization pattern 138 is the topmost metallization pattern of the redistribution structure 120. In some embodiments, the metallization patterns 134, 130, and 126 are formed to a greater pitch than the metallization pattern 138**.

Figure 7:
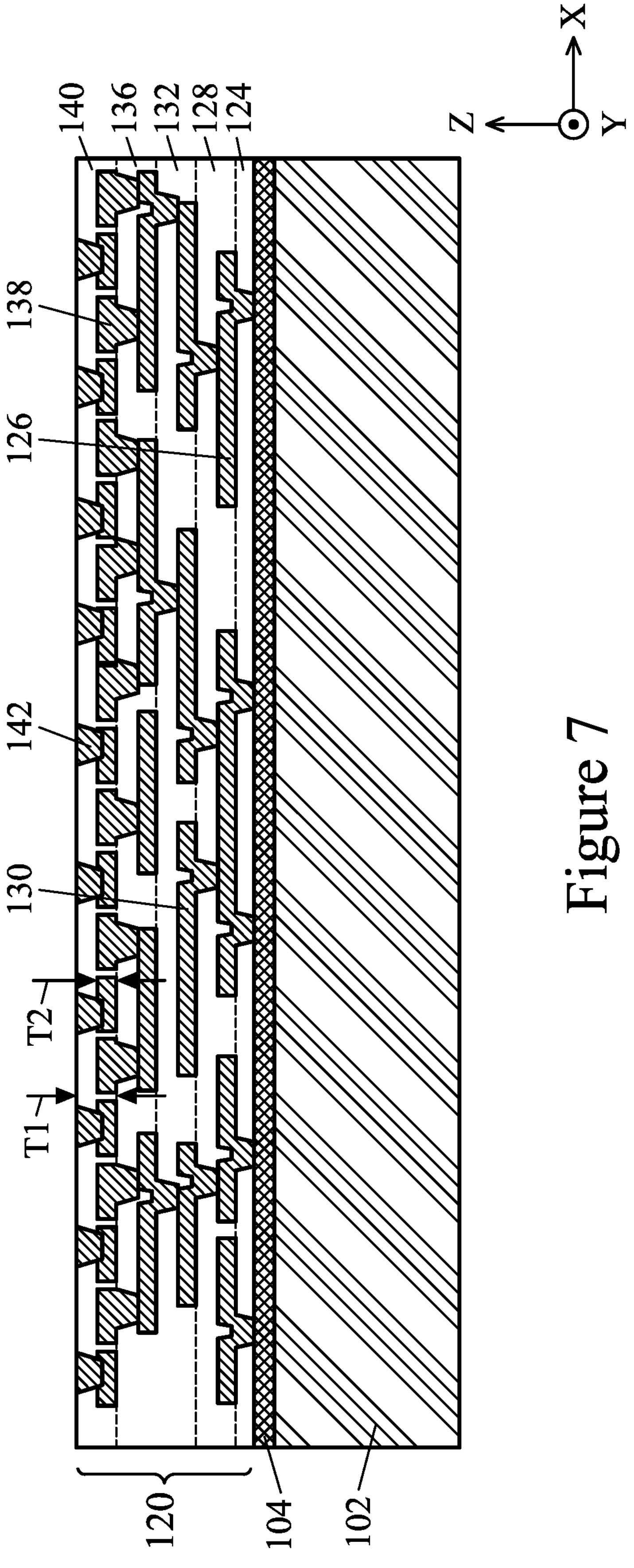

In FIG. 7, the dielectric layer 140 is deposited on the metallization pattern 138 and the dielectric layer 136. In some embodiments, the dielectric layer 140 is formed in a manner similar to the dielectric layer 124, and is formed of a similar material as the dielectric layer 124. The dielectric layer 140 is then patterned. The patterning forms openings exposing portions of the metallization pattern 138. In some embodiments, the patterning is performed by an acceptable process, such as by exposing and developing the dielectric layer 140 to light when the dielectric layer 140 is a photo-sensitive material or by etching using, for example, an anisotropic etch.

The dielectric layer 140 has a thickness T1 and the conductive features of the metallization pattern 138 have a thickness T2. In some embodiments, the thickness T1 of the dielectric layer 140 is greater than the thickness T2 of the metallization pattern 138. In some embodiments, the thickness T1 is in the range of 5 μm to 20 μm. In some embodiments, the thickness T1 is in the range of 5 μm to 8 μm. In some embodiments, the thickness T2 is in the range of 2 μm to 15 μm. In some embodiments, the thickness T2 is in the range of 2 μm to 5 μm.

In some embodiments, the metallization pattern 138 has a different size than the metallization patterns 126, 130, and 134. For example, in some embodiments, the conductive lines and/or vias of the metallization pattern 138 may be wider or thicker than the conductive lines and/or vias of the metallization patterns 126, 130, and 134. In some embodiments, the conductive lines and/or vias of the metallization pattern 138 may be the same width and/or thickness as the conductive lines and/or vias of the metallization patterns 126, 130, and 134.

In some embodiments, the dielectric layer 140 has a different thickness than the dielectric layers 124, 128, 132, and 136. For example, in some embodiments, the dielectric layer 140 may be thicker than the dielectric layers 124, 128, 132, and 136. In some embodiments, the dielectric layer 140 may be the same thickness as the dielectric layers 124, 128, 132, and 136.

Conductive vias 142 are then formed in the openings in the dielectric layer 140 to physically and electrically couple the metallization pattern 138. As an example to form the conductive vias 142, a seed layer is formed in the openings extending through the dielectric layer 140. In some embodiments, the seed layer is a metal layer, which is a single layer or a composite layer comprising a plurality of sub-layers formed of different materials. In some embodiments, the seed layer comprises a titanium layer and a copper layer over the titanium layer. In some embodiments, the seed layer is formed using, for example, PVD or the like. A conductive material is then formed on the seed layer in the openings. In some embodiments, the conductive material is formed by plating, such as electroplating or electroless plating, or the like. In some embodiments, the conductive material includes a metal, like copper, titanium, tungsten, aluminum, or the like. The combination of the conductive material and underlying portions of the seed layer form the conductive vias 142. In some embodiments, a planarization process is performed to form a substantially planar top surface of the dielectric layer 140 and the conductive vias 142. In some embodiments, the planarization process includes, for example, a chemical mechanical polish (CMP) process.

Figure 8:
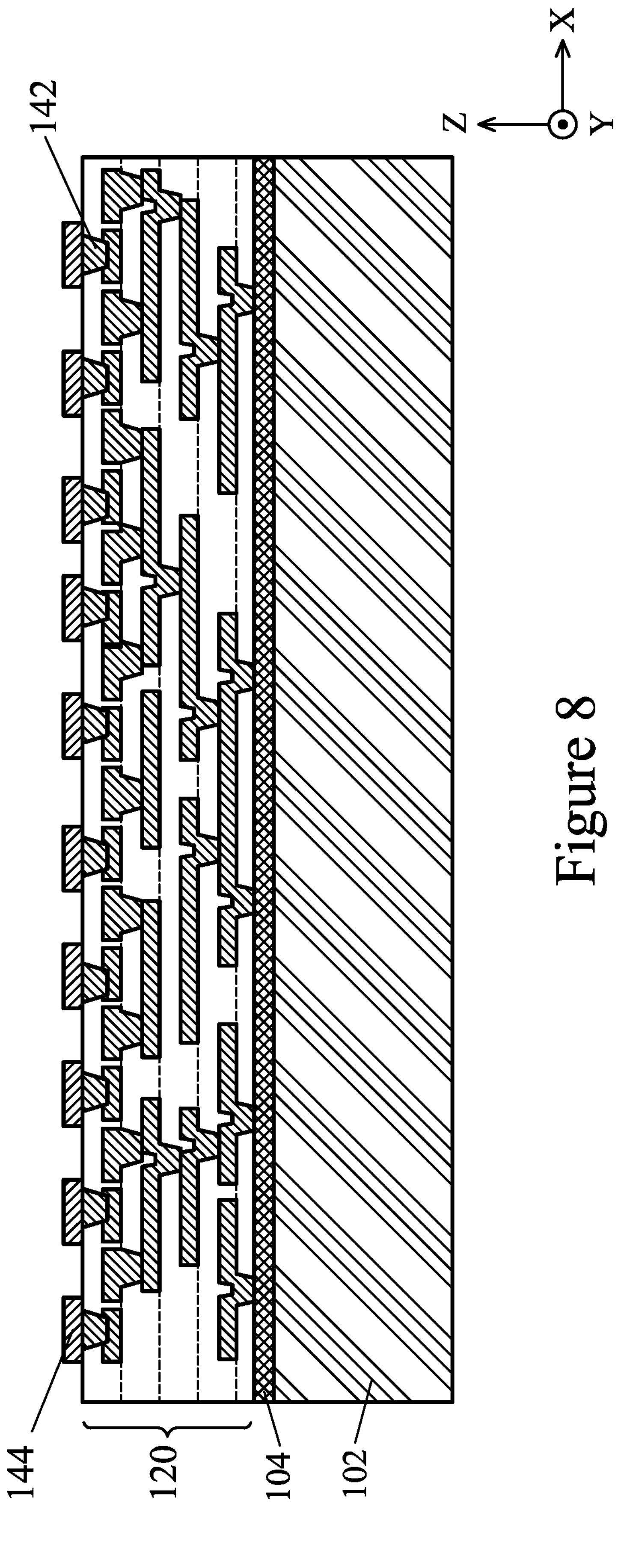

In FIG. 8, under-bump metallurgies (UBMs) 144 are formed for external connection to the conductive vias 142. The UBMs 144 may be referred to as pads 144. The UBMs 144 have bump portions on and extending along the major surface of the dielectric layer 140 and physically and electrically couple the conductive vias 142. In some embodiments, the UBMs 144 are formed of the same material as the conductive vias 142. In some embodiments, the UBMs 144 have a different size than the metallization patterns 126, 130, 134, and 138.

As an example, in some embodiments, the UBMs 144 are formed by first forming a seed layer over the dielectric layer 140 and the conductive vias 142. In some embodiments, the seed layer is a metal layer, which may be a single layer or a composite layer comprising a plurality of sub-layers formed of different materials. In some embodiments, the seed layer comprises a titanium layer and a copper layer over the titanium layer. In some embodiments, the seed layer is formed using, for example, PVD or the like. A photoresist is then formed and patterned on the seed layer. In some embodiments, the photoresist is formed by spin coating or the like and may be exposed to light for patterning. The pattern of the photoresist corresponds to the UBMs 144. The patterning forms openings through the photoresist to expose the seed layer. A conductive material is then formed in the openings of the photoresist and on the exposed portions of the seed layer. In some embodiments, the conductive material is formed by plating, such as electroplating or electroless plating, or the like. In some embodiments, the conductive material includes a metal, like copper, titanium, tungsten, aluminum, or the like. In some embodiments, the UBMs 144 includes alloys such as electroless nickel, electroless palladium, immersion gold, electroless nickel, or the like. The combination of the conductive material and underlying portions of the seed layer form the UBMs 144. The photoresist and portions of the seed layer on which the conductive material is not formed are removed. In some embodiments, the photoresist is removed by an acceptable ashing or stripping process, such as using an oxygen plasma or the like. Once the photoresist is removed, exposed portions of the seed layer are removed using an acceptable etching process, such as wet or dry etching.

Figure 9:
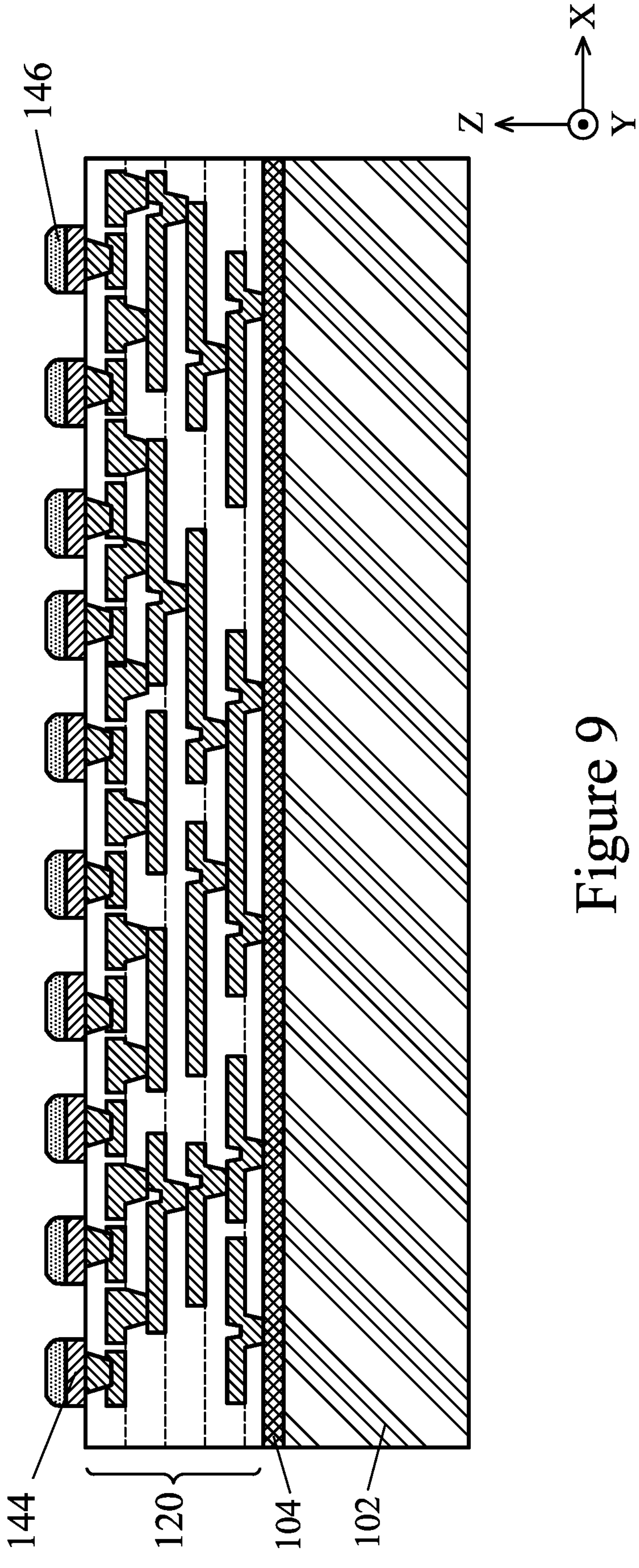

In FIG. 9, conductive connectors 146 are formed on the UBMs 144. In some embodiments, the conductive connectors 146 includes ball grid array (BGA) connectors, solder balls, metal pillars, controlled collapse chip connection (C4) bumps, micro bumps, electroless nickel-electroless palladium-immersion gold technique (ENEPIG) formed bumps, or the like. In some embodiments, the conductive connectors 146 includes a conductive material such as solder, copper, aluminum, gold, nickel, silver, palladium, tin, the like, or a combination thereof. In some embodiments, the conductive connectors 146 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 146 comprise metal pillars (such as a copper pillar) formed by sputtering, printing, electro plating, electroless plating, CVD, or the like. In some embodiments, the metal pillars are solder free and have substantially vertical sidewalls. In some embodiments, a metal cap layer is formed on the top of the metal pillars. In some embodiments, the metal cap layer includes nickel, tin, tin-lead, gold, silver, palladium, indium, nickel-palladium-gold, nickel-gold, the like, or a combination thereof and may be formed by a plating process.

Figure 10:
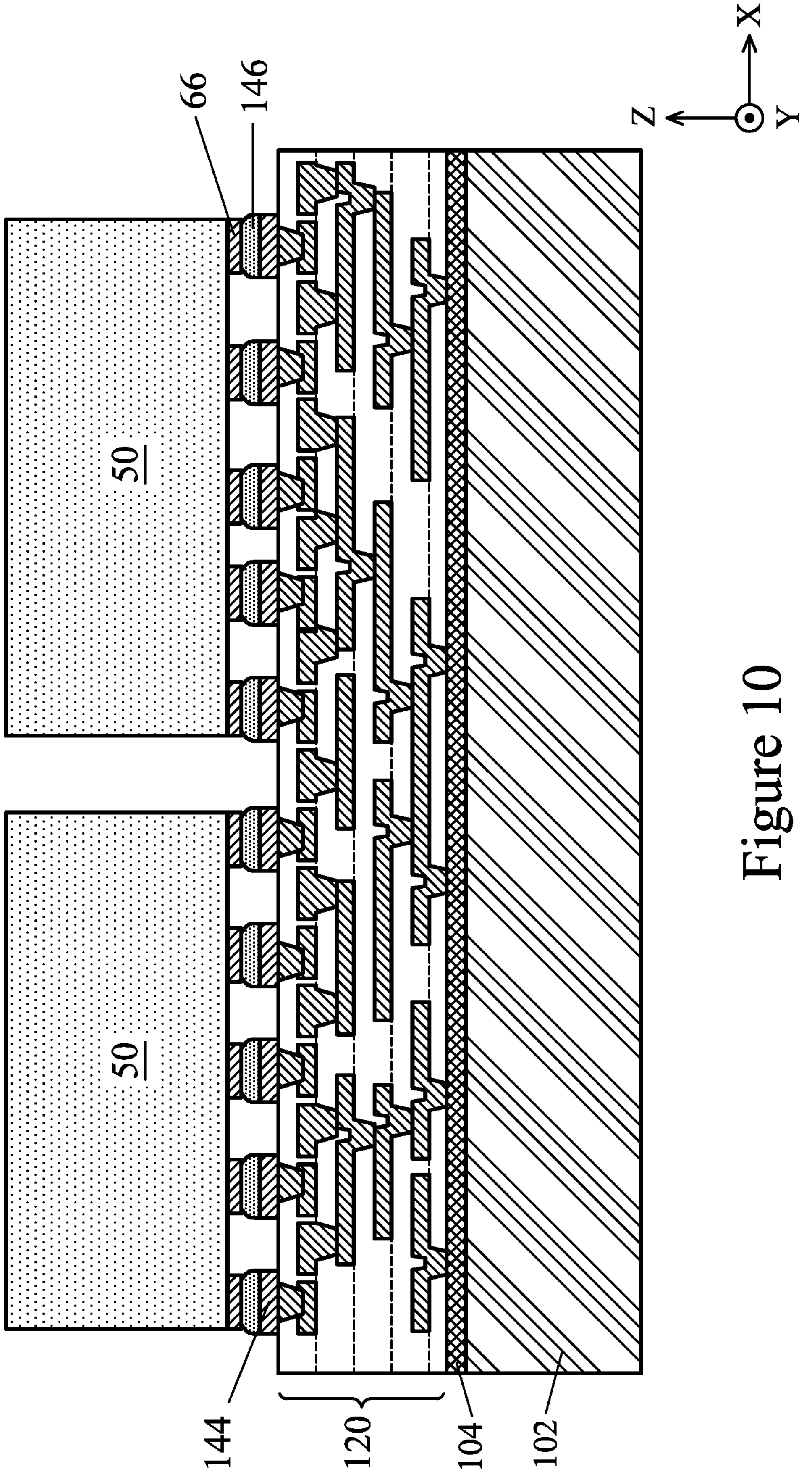

In FIG. 10, integrated circuit dies 50 are attached to the structure of FIG. 9. A desired type and quantity of integrated circuit dies 50 are adopted. In some embodiments, the integrated circuit dies 50 are referred to as package modules 50. In the embodiment shown, multiple integrated circuit dies 50 are adhered adjacent one another. For example, one of the integrated circuit dies 50 may be a logic device, such as a central processing unit (CPU), a graphics processing unit (GPU), a system-on-a-chip (SoC), a microcontroller, or the like. The other integrated circuit die 50 may be a memory device, such as a dynamic random access memory (DRAM) die, a static random access memory (SRAM) die, a hybrid memory cube (HMC) module, a high bandwidth memory (HBM) module, or the like. In some embodiments, the integrated circuit dies 50 are the same type of dies, such as SoC dies. In some embodiments, the integrated circuit dies 50 are formed in the processes of the same technology node, or they are formed in the processes of different technology nodes. For example, one of the integrated circuit dies 50 may be of a more advanced process node than the other of the integrated circuit dies 50. The integrated circuit dies 50 may be different sizes (e.g., different heights and/or surface areas), or they may be the same size (e.g., the same height and/or surface area).

In some embodiments, the integrated circuit dies 50 are attached to the conductive connectors 146. That is, the die connectors 66 of the integrated circuit dies 50 are connected to the conductive connectors 146 opposite the UBMs 144.

In some embodiments, the conductive connectors 146 are reflowed to attach the integrated circuit dies 50 to the UBMs 144. The conductive connectors 146 electrically and/or physically couple the redistribution structure 120, including metallization patterns in the redistribution structure 120, to the integrated circuit dies 50.

In some embodiments, the conductive connectors 146 have an epoxy flux (not shown) formed thereon before they are reflowed with at least some of the epoxy portion of the epoxy flux remaining after the integrated circuit dies 50 are attached to the redistribution structure 120. This remaining epoxy portion may act as an underfill to reduce stress and protect the joints resulting from reflowing the conductive connectors 146.

Figure 11:
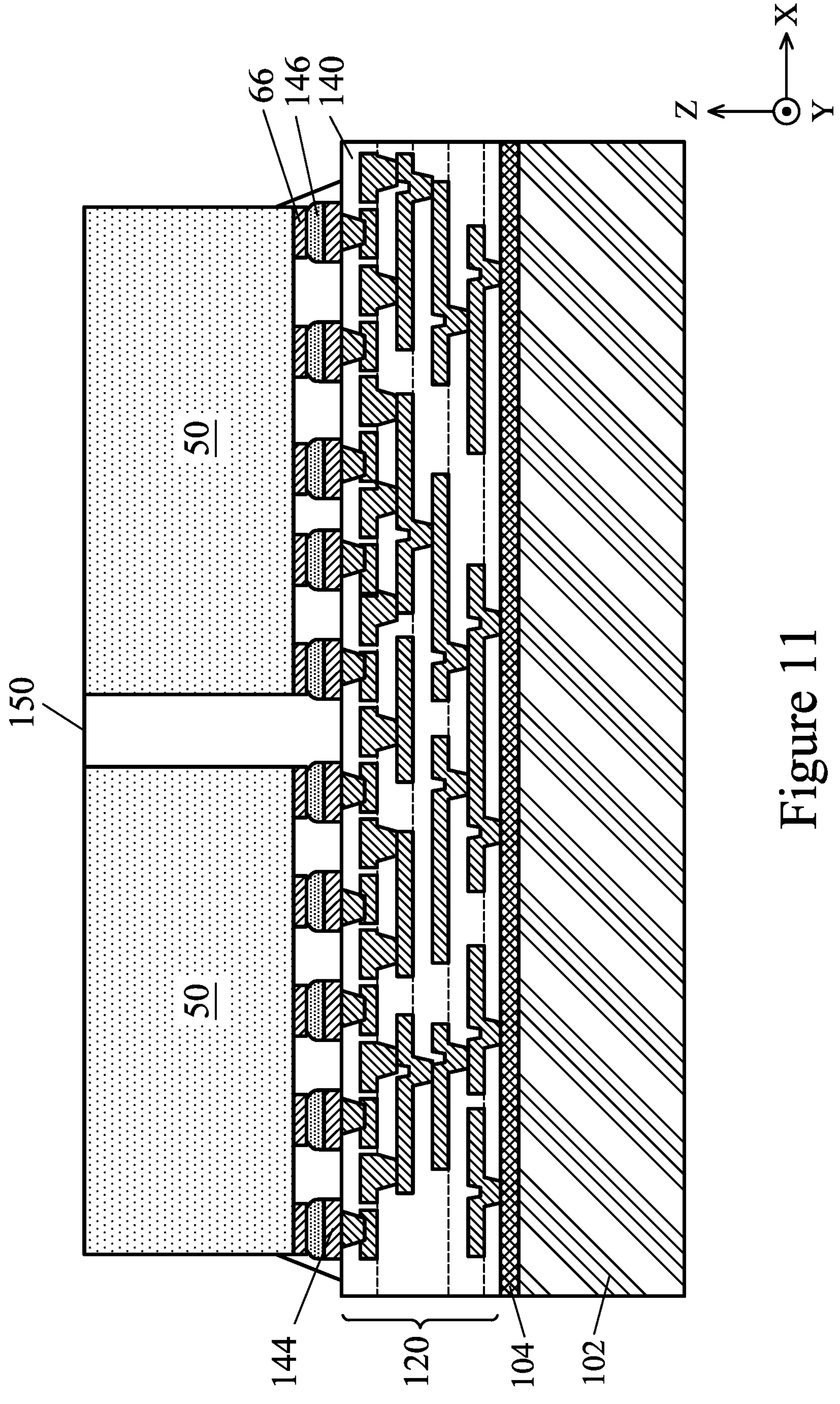

In FIG. 11, an underfill 150 is formed between the integrated circuit dies 50 and the dielectric layer 140, including between and around the UBMs 144, the conductive connectors 146, and the die connectors 66. In some embodiments, the underfill 150 is formed by a capillary flow process after the integrated circuit dies 50 are attached or is formed by a suitable deposition method before the integrated circuit dies 50 are attached. In some embodiments, the underfill 150 is also between the integrated circuit dies 50.

Figure 12:
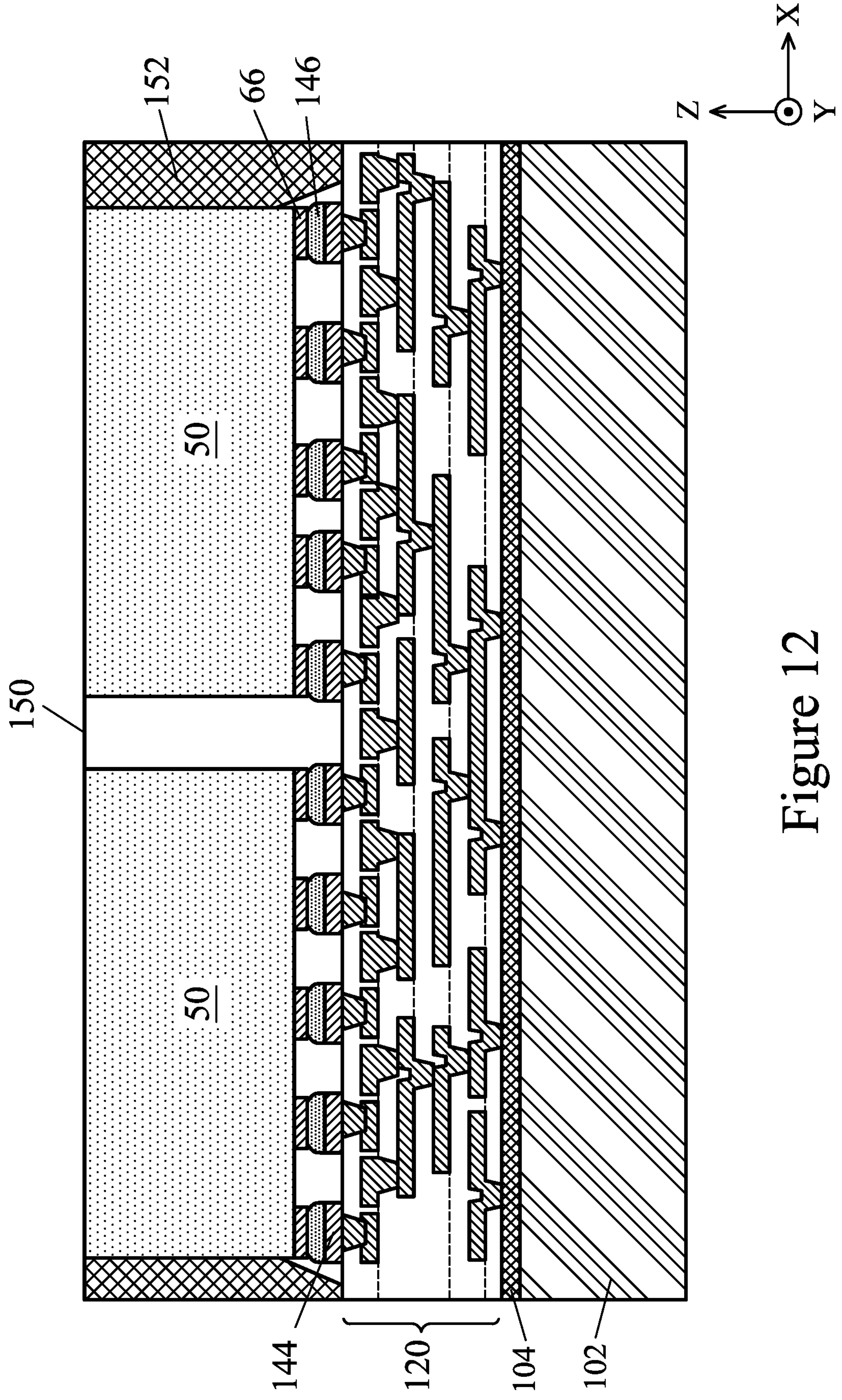

In FIG. 12, an encapsulant 152 is formed around the integrated circuit dies 50, the conductive connectors 146, and the underfill 150. After formation, the encapsulant 152 encapsulates the conductive connectors 146 and the integrated circuit dies 50. In some embodiments, the encapsulant 152 is a molding compound, epoxy, or the like. In some embodiments, the encapsulant 152 is applied by compression molding, transfer molding, or the like. In some embodiments, the encapsulant 152 is applied in liquid or semi-liquid form and then subsequently cured. In some embodiments, a planarization step may be performed to remove and planarize an upper surface of the encapsulant 152. In some embodiments, surfaces of the underfill 150, the encapsulant 152, and the integrated circuits dies 50 are coplanar (within process variation).

Figure 13:
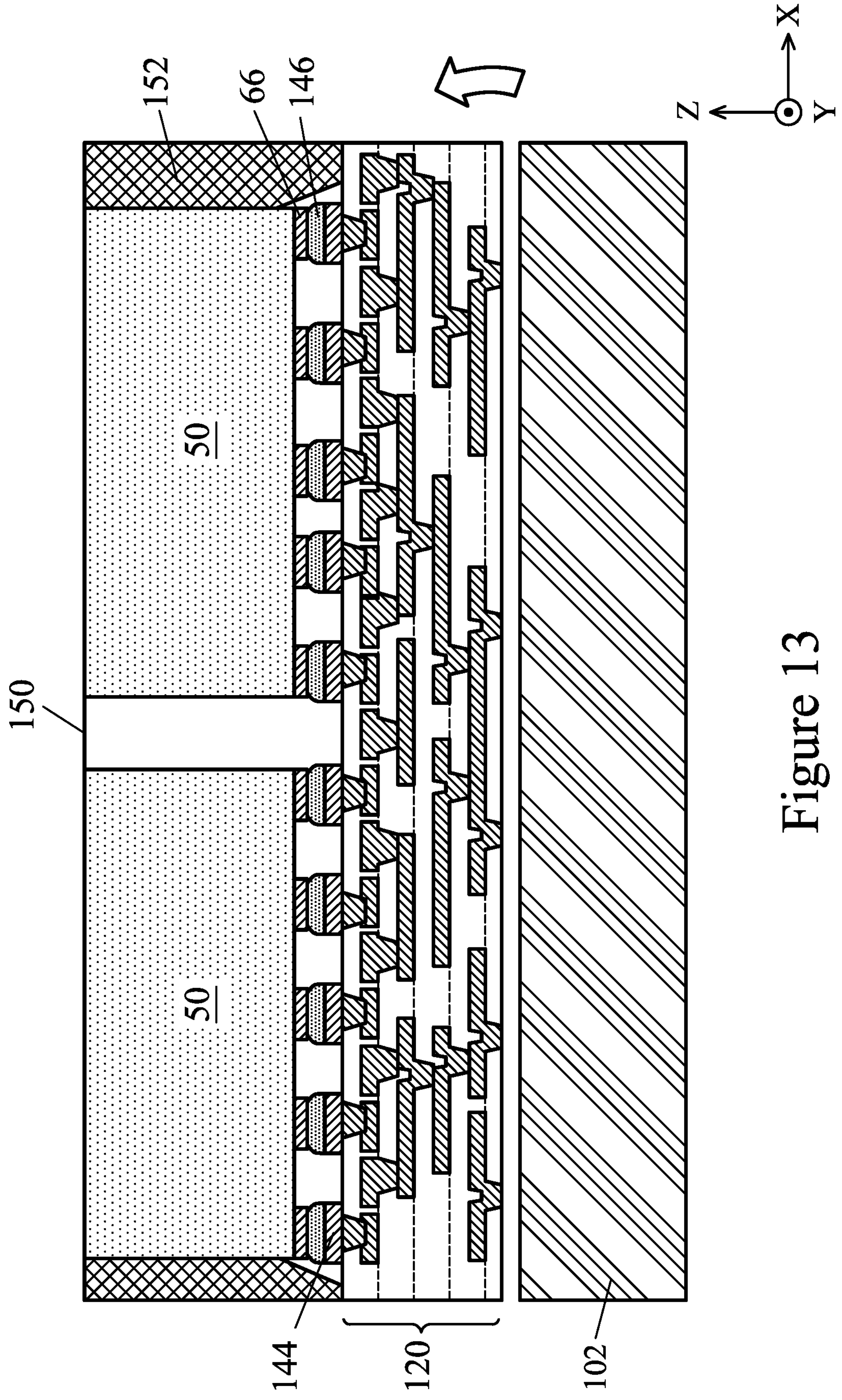

In FIG. 13, a carrier substrate de-bonding is performed to detach (or "de-bond") the carrier substrate 102 from the redistribution structure 120, e.g., the dielectric layer 124. In accordance with some embodiments, the de-bonding includes projecting a light such as a laser light or an UV light on the release layer 104 so that the release layer 104 decomposes under the heat of the light and the carrier substrate 102 can be removed. The structure is then flipped over and placed on a tape (not shown).

Figure 14:
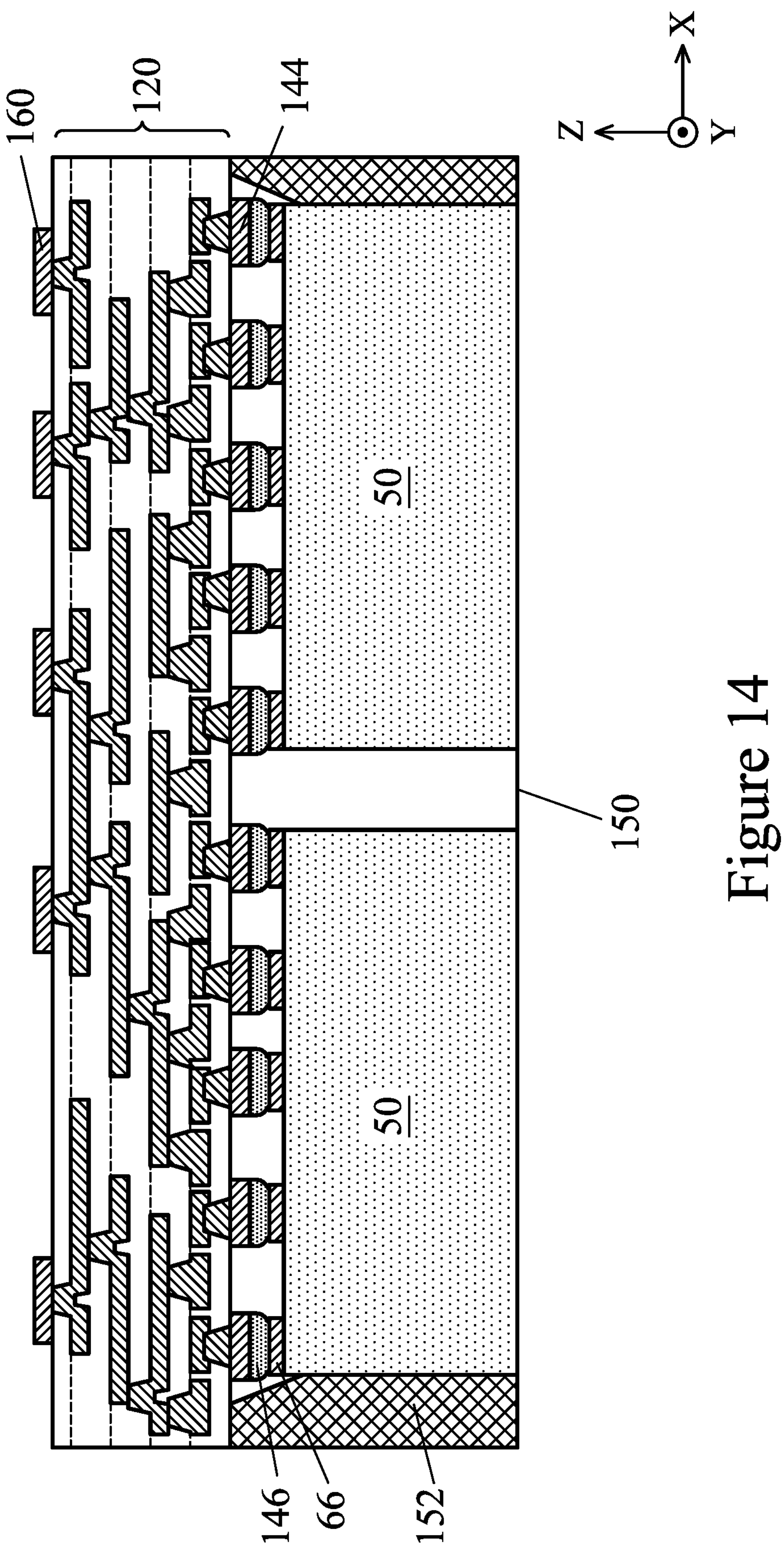

In FIG. 14, UBMs 160 are formed for external connection to the redistribution structure 120, e.g., the metallization pattern 126. The UBMs 160 have bump portions on and extending along the major surface of the dielectric layer 124. In some embodiments, the UBMs 160 are formed of the same material as the metallization pattern 126.

Figure 15:
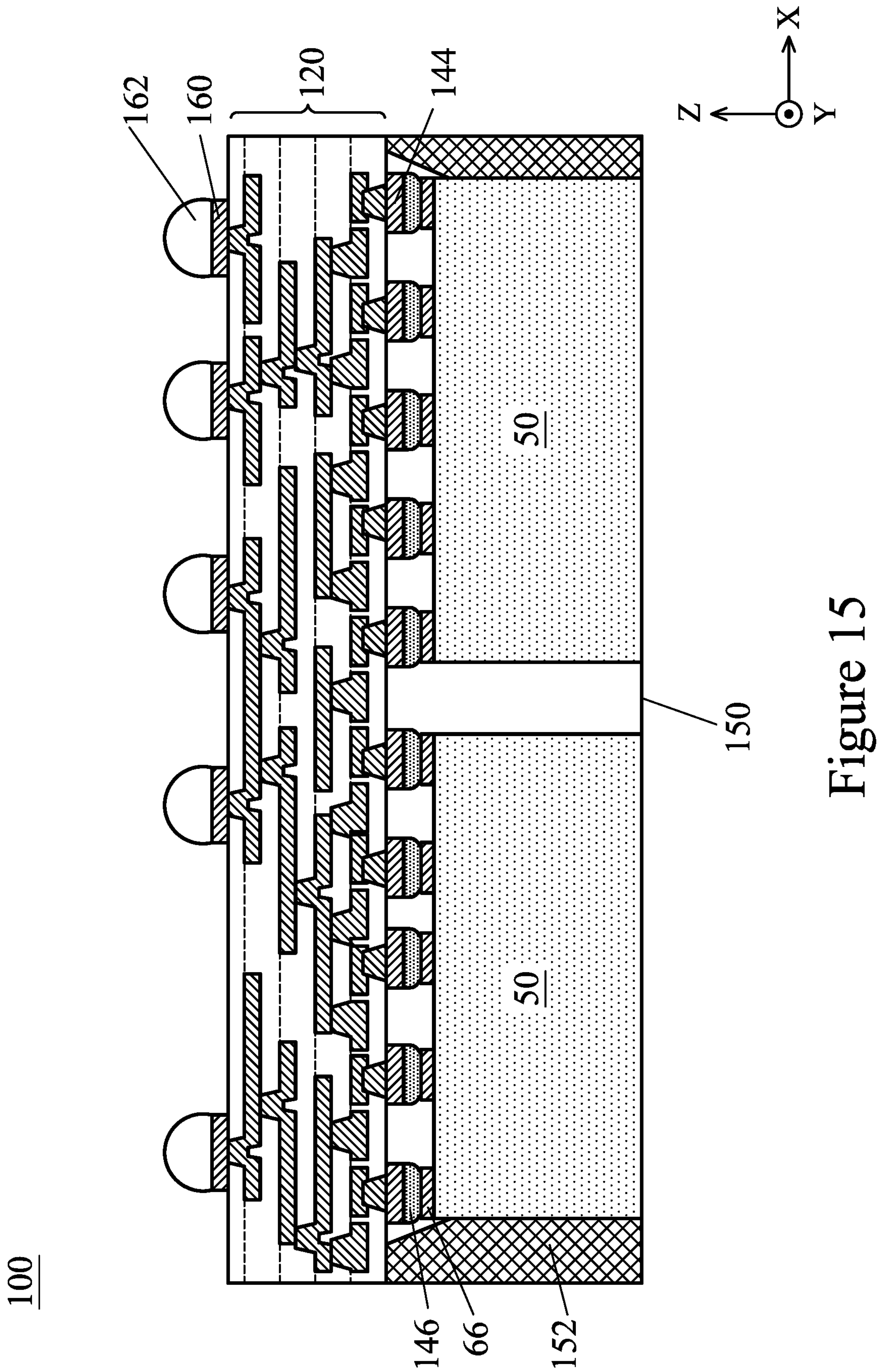

In FIG. 15, conductive connectors 162 are formed on the UBMs 160. The conductive connectors 162 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. In some embodiments, the conductive connectors 162 include a conductive material such as solder, copper, aluminum, gold, nickel, silver, palladium, tin, the like, or a combination thereof. In some embodiments, the conductive connectors 162 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 162 comprise metal pillars (such as a copper pillar) formed by sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 16:
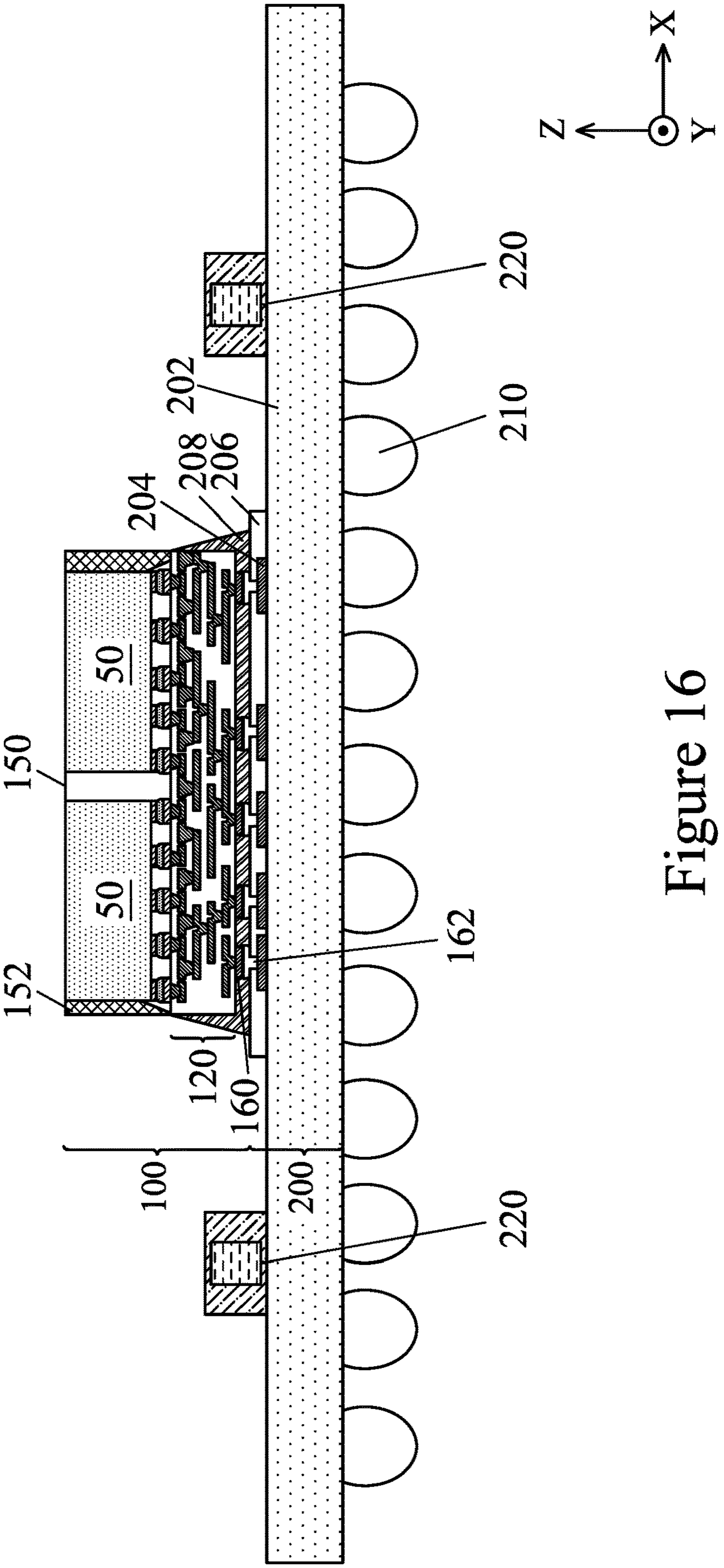
FIGS. 16 and 17 illustrate cross-sectional views of formation and implementation of package component stacks in accordance with some embodiments.

In FIG. 16, the first package component 100 may be mounted to the second package component 200 using the conductive connectors 162. The second package component 200 includes a substrate 202 and bond pads 204 over the substrate core 202. In some embodiments, the substrate 202 is made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, in some embodiments, the substrate 202 is a semiconductor-on-insulator (SOI) substrate. Generally, an SOI substrate includes a layer of a semiconductor material such as epitaxial silicon, germanium, silicon germanium, SOI, SGOI, or combinations thereof. The substrate 202 is, in one alternative embodiment, based on an insulating core such as a fiberglass reinforced resin core. One example core material is fiberglass resin. Alternatives for the core material include bismaleimide-triazine (BT) resin, or alternatively, other PCB materials or films. Build up films or other laminates may be used for substrate 202.

In some embodiments, the second package component 200 includes bump structures 210. In some embodiments, the bump structures 210 may be conductive ball structures (such as ball grid array (BGA)), conductive pillar structures, or conductive paste structures that are mounted on and electrically coupled to the substrate 202 in the bonding process.

In some embodiments, one or more electronic component 220 is formed on the second package component 200. The electronic component 220 is bonded to and exposed from the substrate 202. In some embodiments, the electronic component 220 is embedded in the substrate 202. In some embodiments, the electronic component 220 may be active and/or passive devices. For example, the electronic component 220 may be a wide variety of devices such as transistors, capacitors, resistors, combinations of these, and the like may be used to generate the structural and functional requirements of the design for the device stack. In some embodiments, the electronic components are formed using any suitable methods.

The substrate 202 may also include metallization layers and vias (not shown), with the bond pads 204 being physically and/or electrically coupled to the metallization layers and vias. In some embodiments, the metallization layers are formed over the active and passive devices and are designed to connect the various devices to form functional circuitry. In some embodiments, the metallization layers are formed of alternating layers of dielectric material (e.g., low-k dielectric material) and conductive material (e.g., copper) with vias interconnecting the layers of conductive material and may be formed through any suitable process (such as deposition, damascene, dual damascene, or the like). In some embodiments, the substrate 202 is substantially free of active and passive devices.

In some embodiments, the conductive connectors 162 are reflowed to attach the first package component 100 to the bond pads 204. The conductive connectors 162 electrically and/or physically couple the second package component 200, including metallization layers in the substrate 202, to the first package component 100. In some embodiments, a solder resist 206 is formed on the substrate 202. In some embodiments, the conductive connectors 162 are disposed in openings in the solder resist 206 to be electrically and mechanically coupled to the bond pads 204. In some embodiments, the solder resist 206 is used to protect areas of the substrate 202 from external damage.

In some embodiments, the conductive connectors 162 have an epoxy flux (not shown) formed thereon before they are reflowed with at least some of the epoxy portion of the epoxy flux remaining after the first package component 100 is attached to the second package component 200. This remaining epoxy portion may act as an underfill to reduce stress and protect the joints resulting from reflowing the conductive connectors 162. In some embodiments, an underfill 208 is formed between the first package component 100 and the second package component 200 and surrounding the conductive connectors 162. In some embodiments, the underfill 208 is formed by a capillary flow process after the second package component 200 is attached or may be formed by a suitable deposition method before the second package component 200 is attached.

Figure 17:
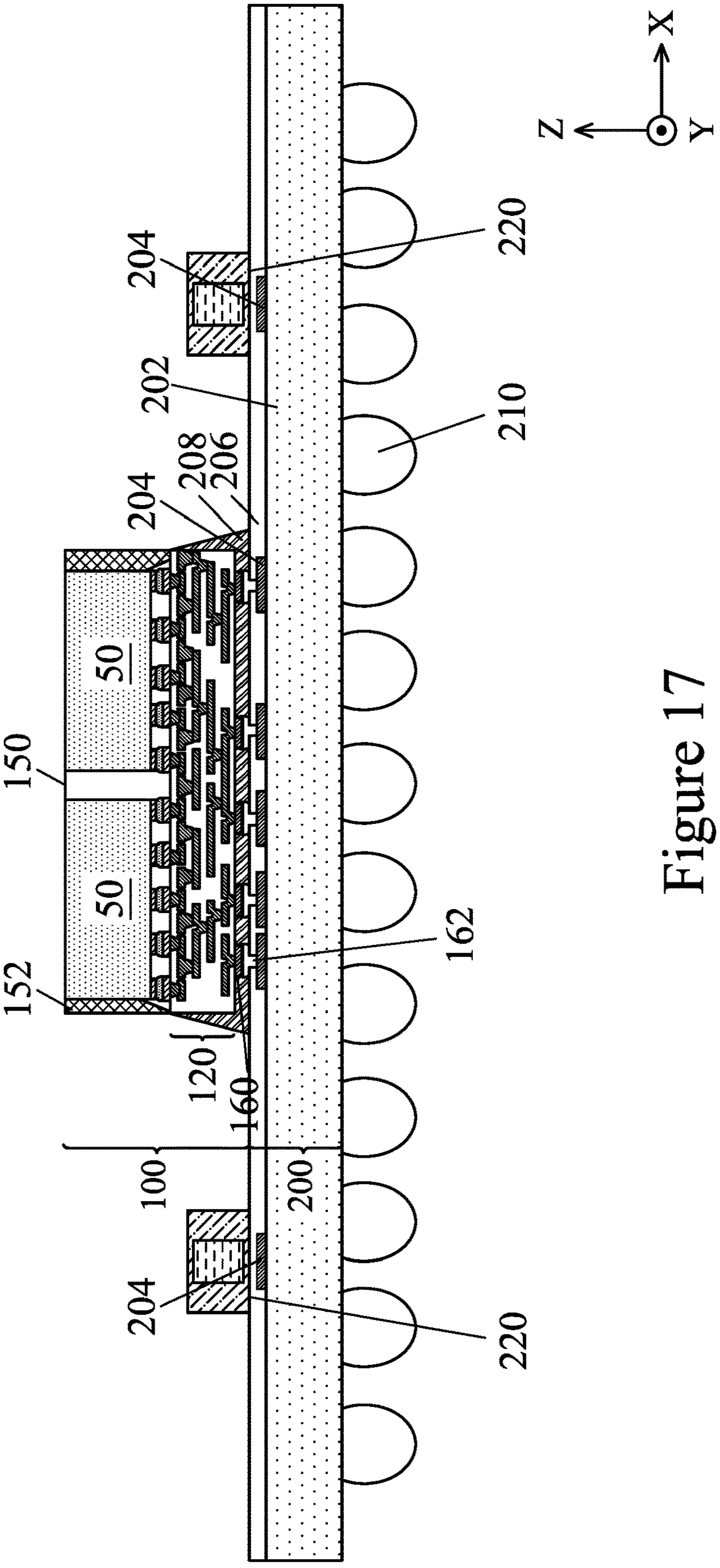

In FIG. 17, the solder resist 206 is formed on the substrate 202. In some embodiments, the solder resist 206 is formed on the entire top surface of the substrate 202, enhancing the protection of the substrate 202 from external damage. The electronic component 220 is electrically and mechanically coupled to the bond pads 204 on the substrate 202.

Figure 18:
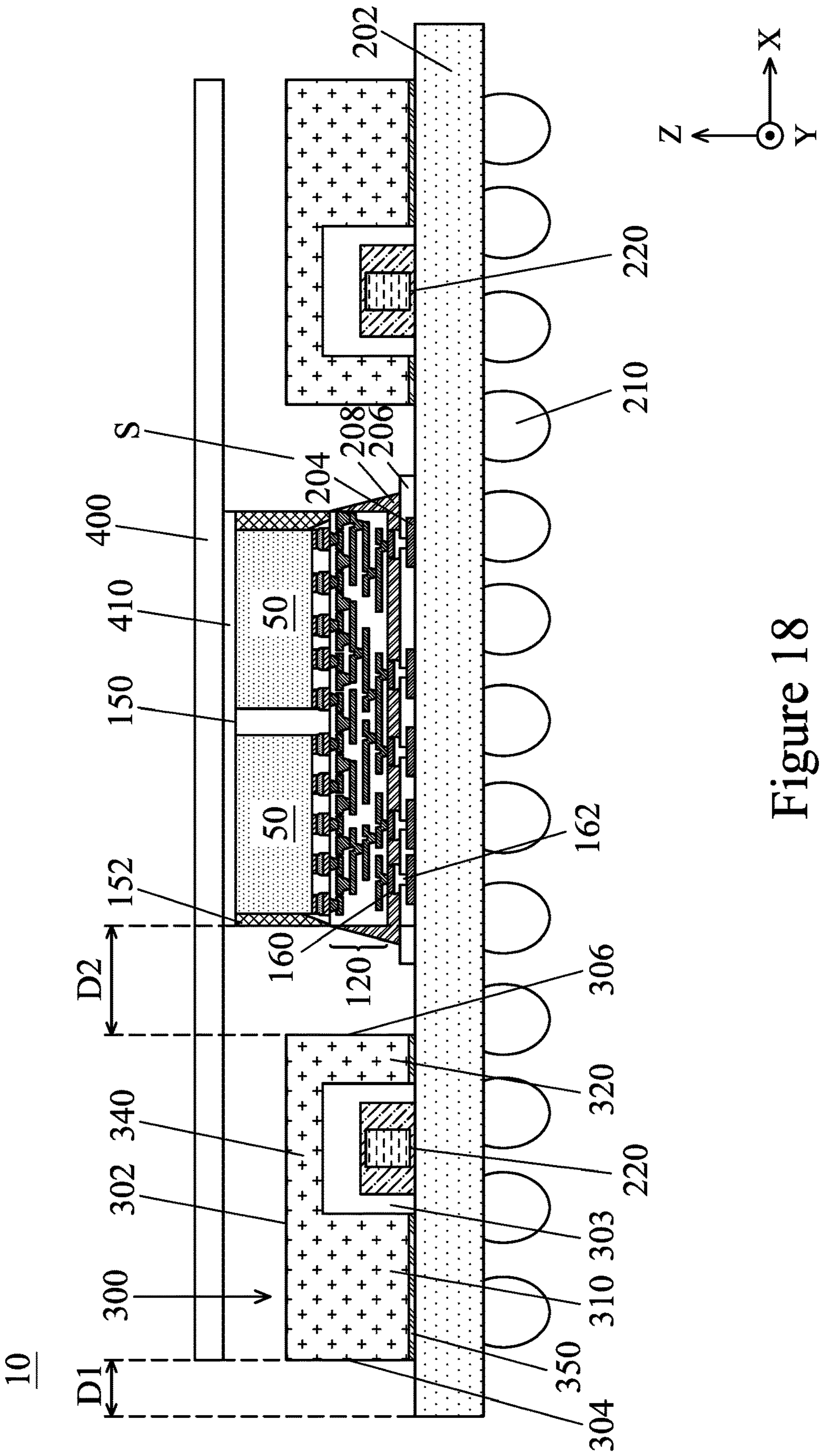
FIGS. 18 and 19 illustrate cross-sectional views of a package structure in accordance with some embodiments.

In FIG. 18, a ring structure 300 is mounted on the second package component 200 to form a package structure 10. In some embodiments, the ring structure 300 is disposed around the first package component 100. For example, an opening S is formed in the ring structure 300 for containing the first package component 100. The ring structure 300 includes a first foot 310, a second foot 320, and a body 340. In some embodiments, the first foot 310 and the second foot 320 are located on a single side of the first package component 100 and extend toward the substrate 202. The body 340 is connected to the first foot 310 and the second foot 320, and a recess 303 is formed by the first foot 310, the second foot 320, and the body 340 for containing the electronic component 220. In some embodiments, a height of the recess 303 is greater than a height of the electronic component 220. Accordingly, the electronic component 220 can be contained in the recess 303 successfully. Similarly, a width of the recess 303 is greater than a width of the electronic component 220, and/or a length of the recess 303 is greater than a length of the electronic component 220.

Accordingly, the electronic component 220 is covered and protected by the ring structure 300, reducing the possibility that the electronic component 220 is damaged. In some embodiments, the electronic component 220 is separated from the first foot 310, the second foot 320, and/or the body 340. As such, a buffer region is provided between the electronic component 220 and the ring structure 300, and the assembly of the package structure 10 is easier, and the possibility that the electronic component 220 is damaged by the ring structure 300 is also reduced.

In some embodiments, the ring structure 300 is attached to the substrate 202 via an adhesive material 350. For example, the adhesive material 350 is disposed on the first foot 310 and the second foot 320. Since the ring structure 300 includes multiple contacts (such as the first foot 310 and the second foot 320) with the substrate 202, it helps to reduce the warpage of the package structure 10.

As shown in FIG. 18, the ring structure 300 has a top surface 302, an outer edge 304, and an inner edge 306 that are substantially perpendicular to each other. In some embodiments, the inner edge 306 faces the first package component 100, the outer edge 304 is opposite to the inner edge 306, and the top surface 302 is connected to the outer edge 304 and the inner edge 306. In some embodiments, the top surface 302 of the ring structure 300 is lower than the top surface of the first package component 100. In this way, a thermal-dissipation device 400 may be disposed on and contact the first package component 100, reducing the possibility that the ring structure 300 interferes with the thermal-dissipation of the first package component 100. In some embodiments, a thermal interface material (TIM) 410 is disposed between the first package component 100 and the thermal-dissipation device 400 to enhance the thermal-dissipation of the first package component 100.

In some embodiments, a distance D1 between the outer edge 304 of the ring structure 300 and an edge of the substrate 202 in the direction X is ranged from 0 to about 10 mm. That is to say, in some embodiments, the outer edge 304 is aligned with the edge of the substrate 202. In some embodiments, a distance D2 between the inner edge 306 of the ring structure 300 and an edge of the first package component 100 (for example, the edge of the encapsulant 152) in the direction X is ranged from 0 to about 10 mm. In some embodiments, the distances D1 and D2 may be the same or different from other, and may be adjusted by those skilled in the art to reduce the warpage of the package structure 10.

Figure 19:
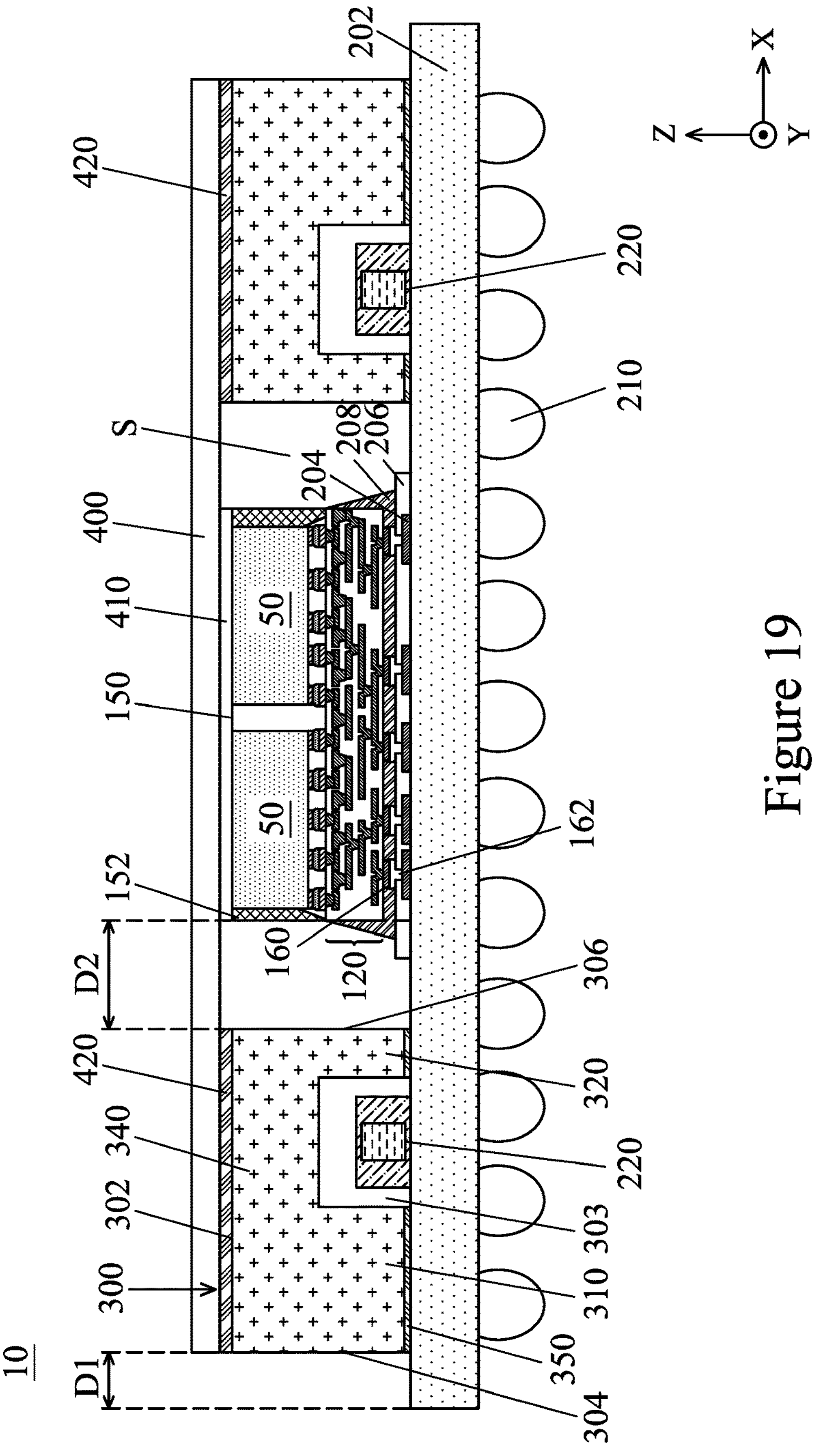

In FIG. 19, the top surface 302 of the ring structure 300 is substantially level with the top surface of the first package component 100. In some embodiments, an adhesive 420 is disposed on the top surface 302 of the ring structure 300. The adhesive 420 is attached to the thermal-dissipation device 400. In some embodiments, the adhesive 420 is substantially level with the thermal interface material 410. As such, the thermal-dissipation device 400 can be substantially level.

Figure 20:
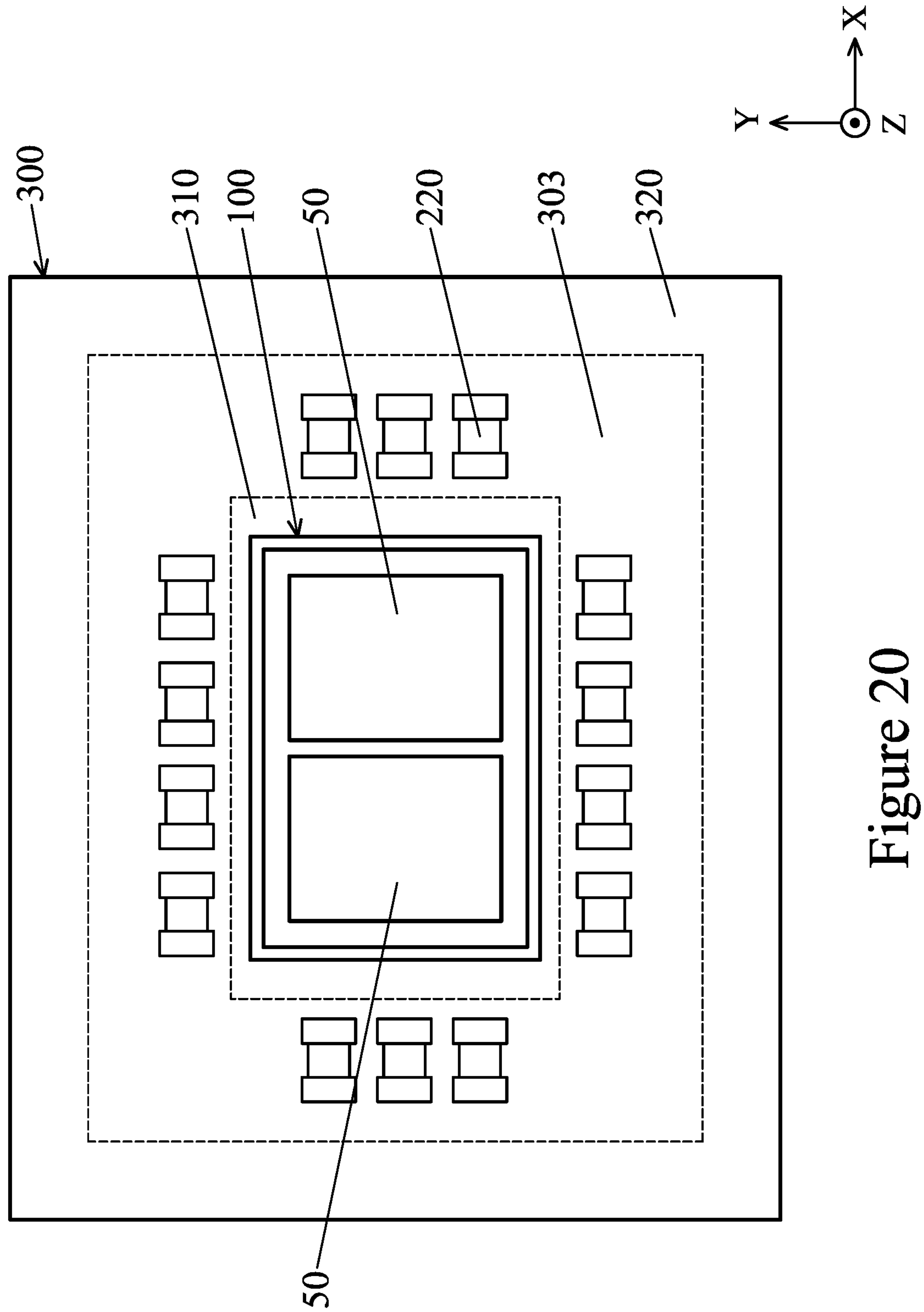
FIG. 20 illustrates a top view of the package structure in accordance with some embodiments.

In FIG. 20, a top view of the package structure 10 is illustrated. It is noted that the thermal-dissipation device 400 is not shown in the present embodiment so as to illustrate the detail of the ring structure 300. In some embodiments, the recess 303 is formed on all sides of the ring structure 300, and a plurality of electronic components 220 are disposed in the recess 303.

Figure 21:
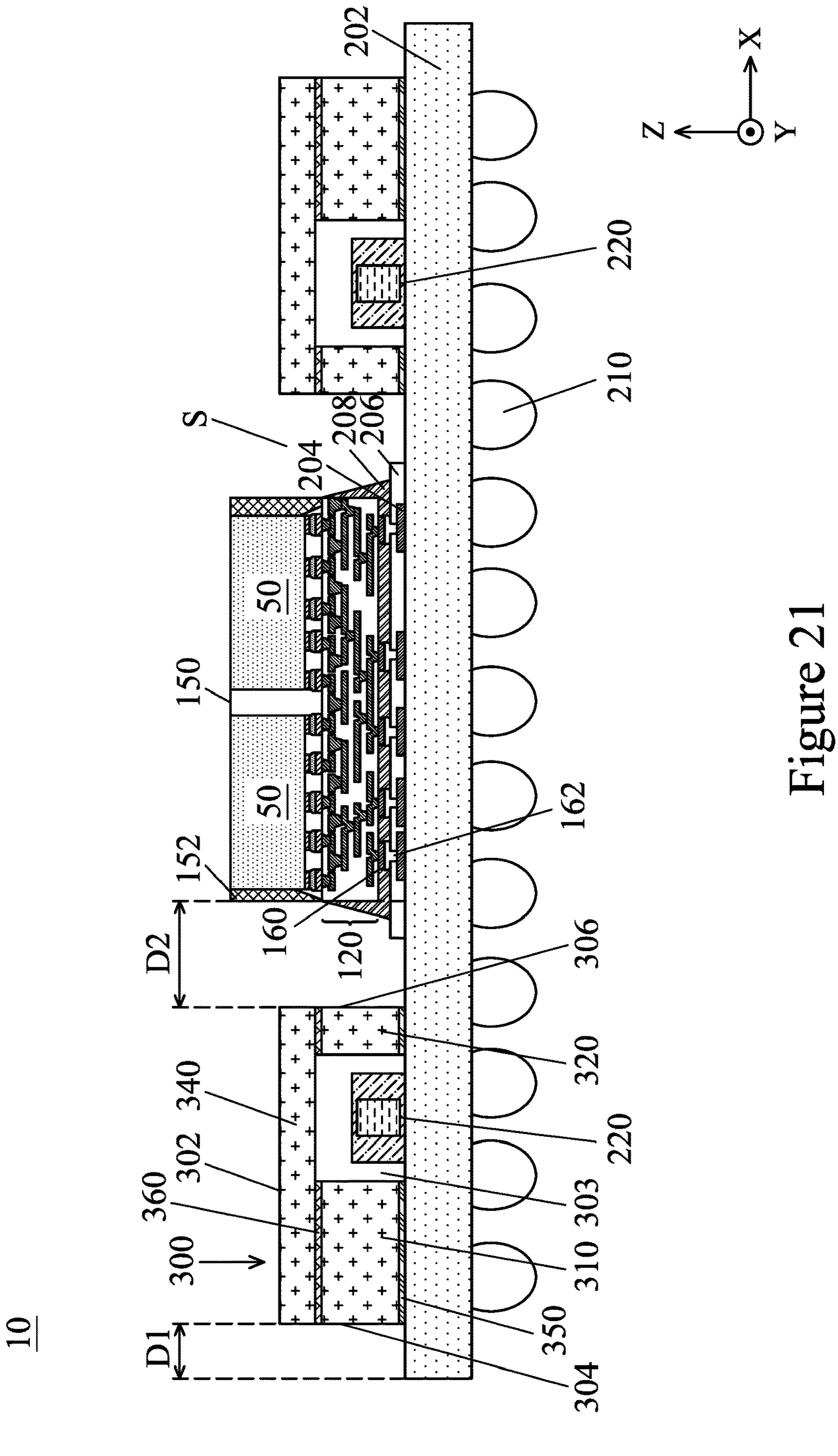
FIG. 21 illustrates a cross-sectional view of the package structure in accordance with some embodiments.

In FIG. 21, the package structure 10 shown in the present embodiment includes the same or similar elements to the package structure 10 shown in FIG. 17. These elements will be denoted as the same numerals for the sake of clarity and simplicity, and will not be discussed in detail again. It is noted that in the present embodiment, the body 340 of the ring structure 300 is bonded to the first foot 310 and the second foot 320 via an adhesive material 360. In some embodiments, the materials of the first foot 310, the second foot 320, and the body 340 are the same. In some embodiments, the materials of the first foot 310, the second foot 320, and the body 340 are different, and those skilled in the art may determine the materials to reduce the warpage of the package structure 10. To be more specific, since the physical properties of the materials are different, those skilled in the art may select different material to reduce the warpage of the package structure 10 in a specific region, enhancing the overall planarity of the package structure 10.

Figure 22:
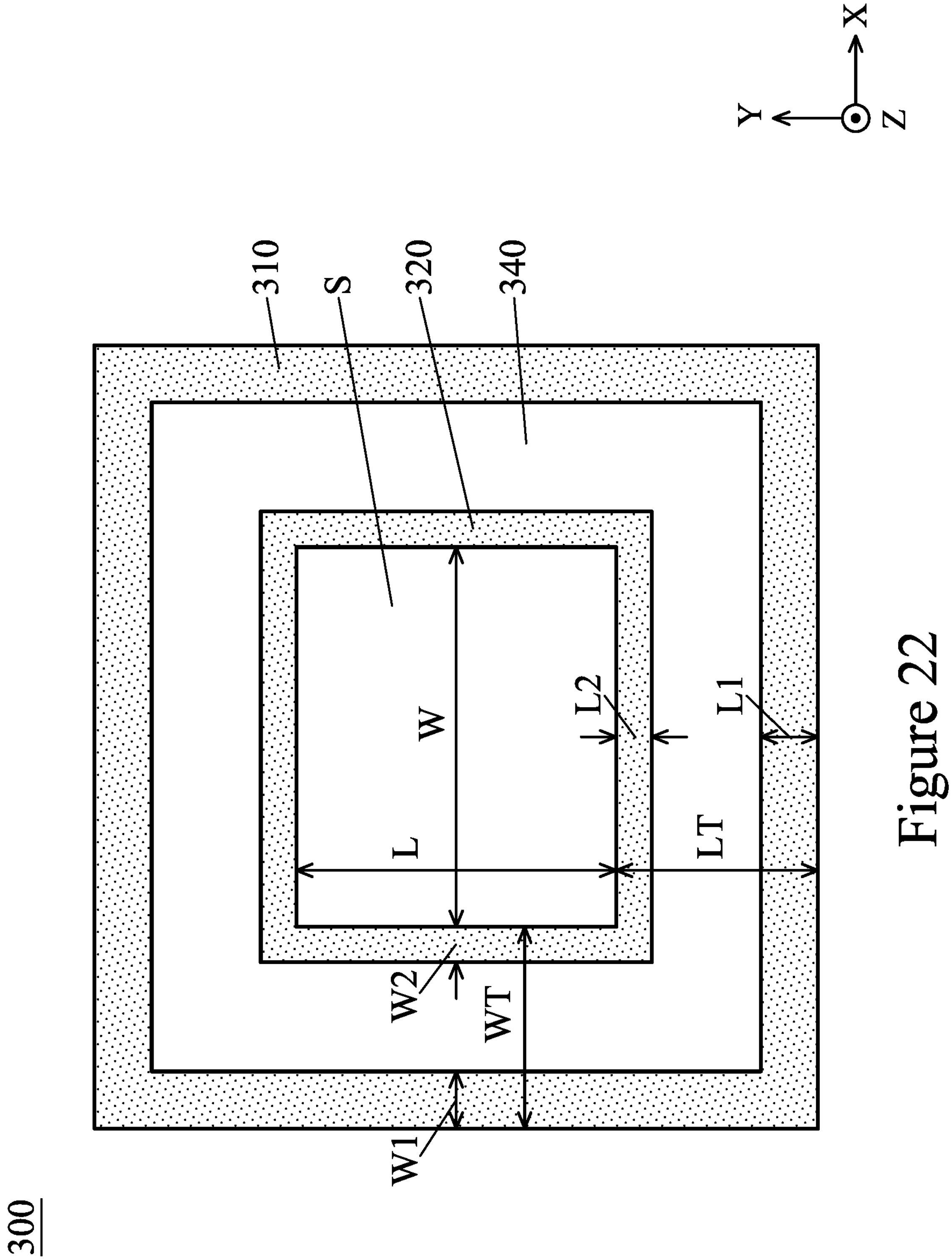
FIGS. 22 through 26 illustrate bottom views of a ring structure of the package structure in accordance with some embodiments.

In FIG. 22, the ring structure 300 has a width WT, the first foot 310 has a width W1, and the second foot 320 has a width W2. The widths WT, W1 and W2 are measured in the direction X, for example. In some embodiments, the width WT is greater than the sum of the widths W1 and W2. In some embodiments, the widths W1 and W2 are equal. In some embodiments, the widths W1 and W2 are different, and the width W1 is greater than the width W2, for example. Similarly, the ring structure 300 has a length LT, the first foot 310 has a length L1, and the second foot 320 has a length L2. The lengths LT, L1 and L2 are measured in the direction Y, for example. In some embodiments, the length LT is greater than the sum of the lengths L1 and L2. In some embodiments, the width WT is greater than the sum of the widths W1 and W2. In some embodiments, the lengths L1 and L2 are equal. In some embodiments, the lengths L1 and L2 are different, and the length L1 is greater than the length L2, for example. In some embodiments, the width WT is equal to the length LT, the width W1 is equal to the length L1, and width W2 is equal to the length L2. However, in some embodiments, the above widths WT, W1, and W2 do not each correspond to the lengths LT, L1, and L2. The opening S has a width W and a length L that corresponds to the first package component 100. In addition, it is noted that the above widths WT, W1, and W2 and the lengths LT, L1, and L2 can be determined to minimize the warpage of the package structure 10.

Figure 23:
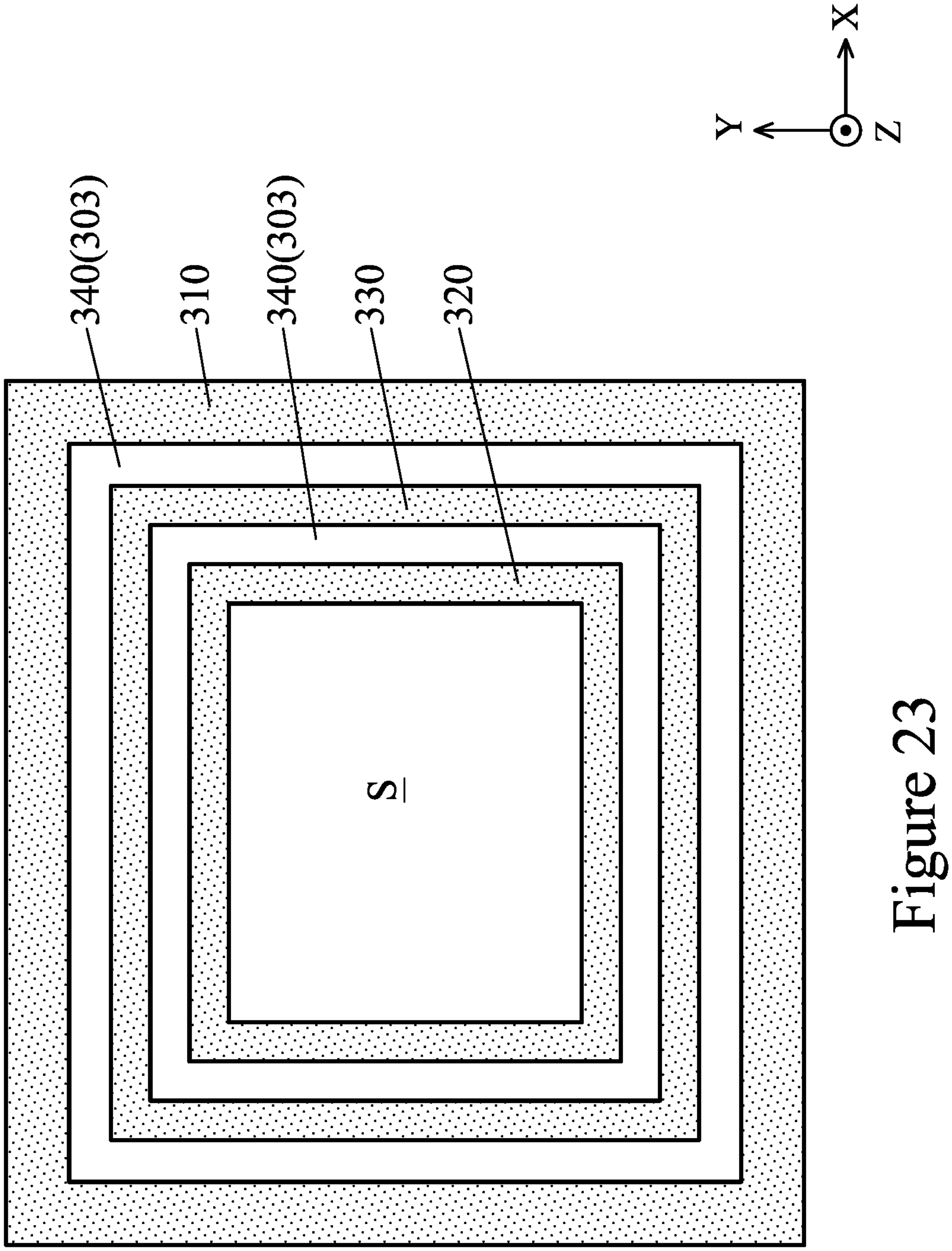

In FIG. 23, the ring structure 300 further has a third foot 330 located between the first foot 310 and the second foot 320. In some embodiments, the third foot 330 is connected to the body 340 and configured to support the body 340. The arrangement of the third foot 330 facilitates reducing the warpage of the package structure 10. In some embodiments, the width of the ring structure 300 is greater than the sum of the widths of the first foot 310, the second foot 320, and the third foot 330. The ring structure 300 further has two recesses 303, wherein one of the recesses 303 is formed between the first foot 310 and the second foot 320, and the other of the recesses 303 is formed between the second foot 320 and the third foot 330. In some embodiments, the electronic component 220 (not shown in the present embodiment) may be located in the recess 303 between the first foot 310 and the second foot 320. In some embodiments, the electronic component 220 may be located in the recess 303 between the second foot 320 and the third foot 330. In some embodiments, multiple electronic components 220 may be located in the both recesses 303. In some embodiments, no electronic component 220 is located in any of the recesses 303.

Figure 24:
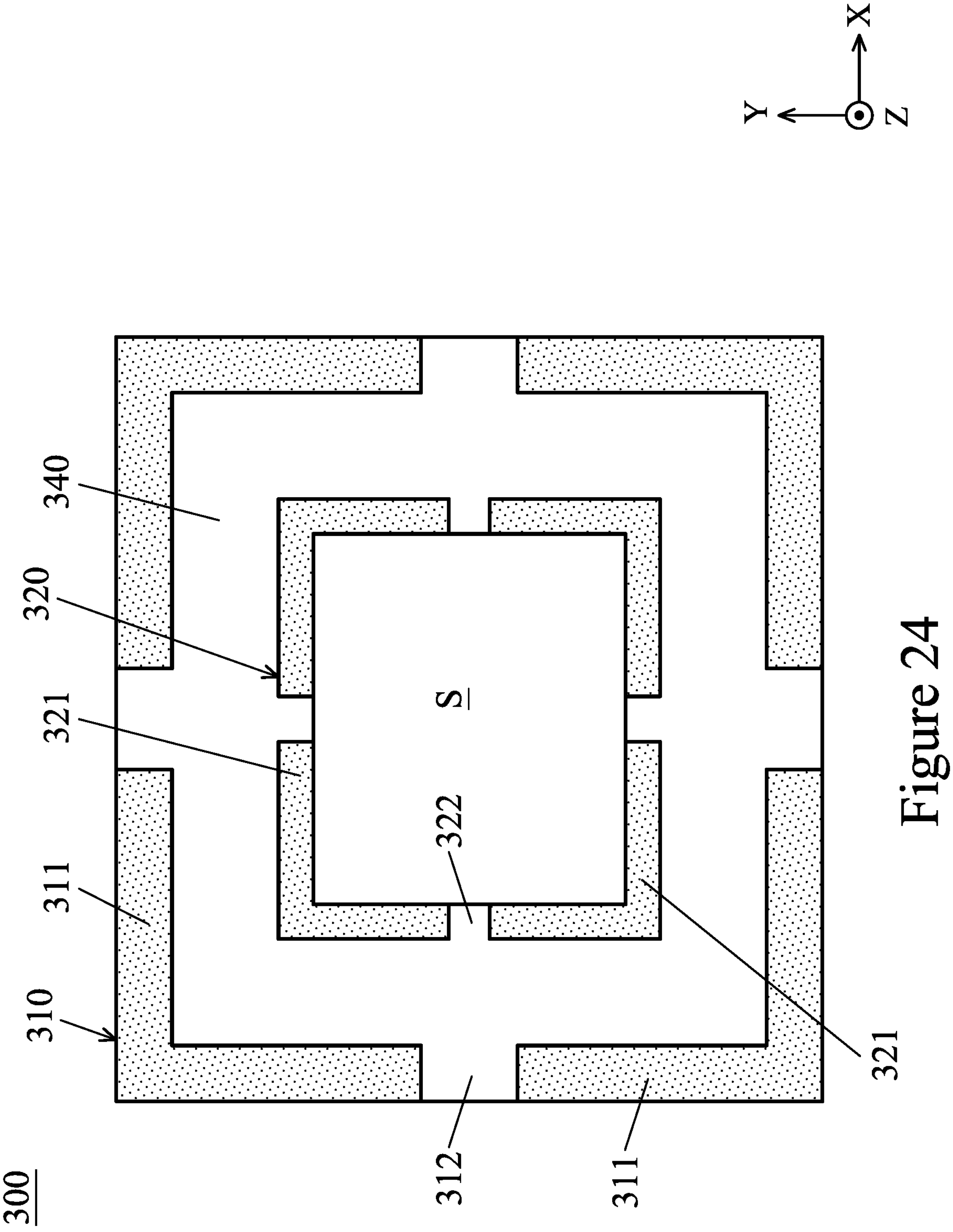

In FIG. 24, the first foot 310 includes a plurality of first segments 311, and an opening 312 is formed between the first segments 311. In some embodiments, the heights of the openings 312 and 322 are less than or substantially the same as the height of the recess 303. The second foot 320 includes a plurality of second segments 321, and an opening 322 is formed between the second segments 321. In some embodiments, the openings 312 and 322 are located on and face the substrate 202. The top surface of the substrate 202 is exposed from the openings 312 and 322. In some embodiments, the opening 312 is substantially aligned with the opening 322. In some embodiments, the opening 312 overlaps with the opening 322 in the direction X or the direction Y. In the present embodiment, one opening 312 and one opening 322 are located on each side of the ring structure 300. The arrangement of the openings 312 and 322 helps to reduce the warpage of the package structure 10. In some embodiments, the sizes of the openings 312 and 322 are different from each other, and the sizes of the openings 312 and 322 may be referred to as the width or length in the direction X or the direction Y. For example, as shown in FIG. 21, the size of the opening 312 is greater than the size of the opening 322 in the direction Y. By controlling the sizes of the openings 312 and 322, the footprints of the first foot 310 and the second foot 320 may be adjusted to optimize the reduction of the warpage of the package structure 10.

Figure 25:
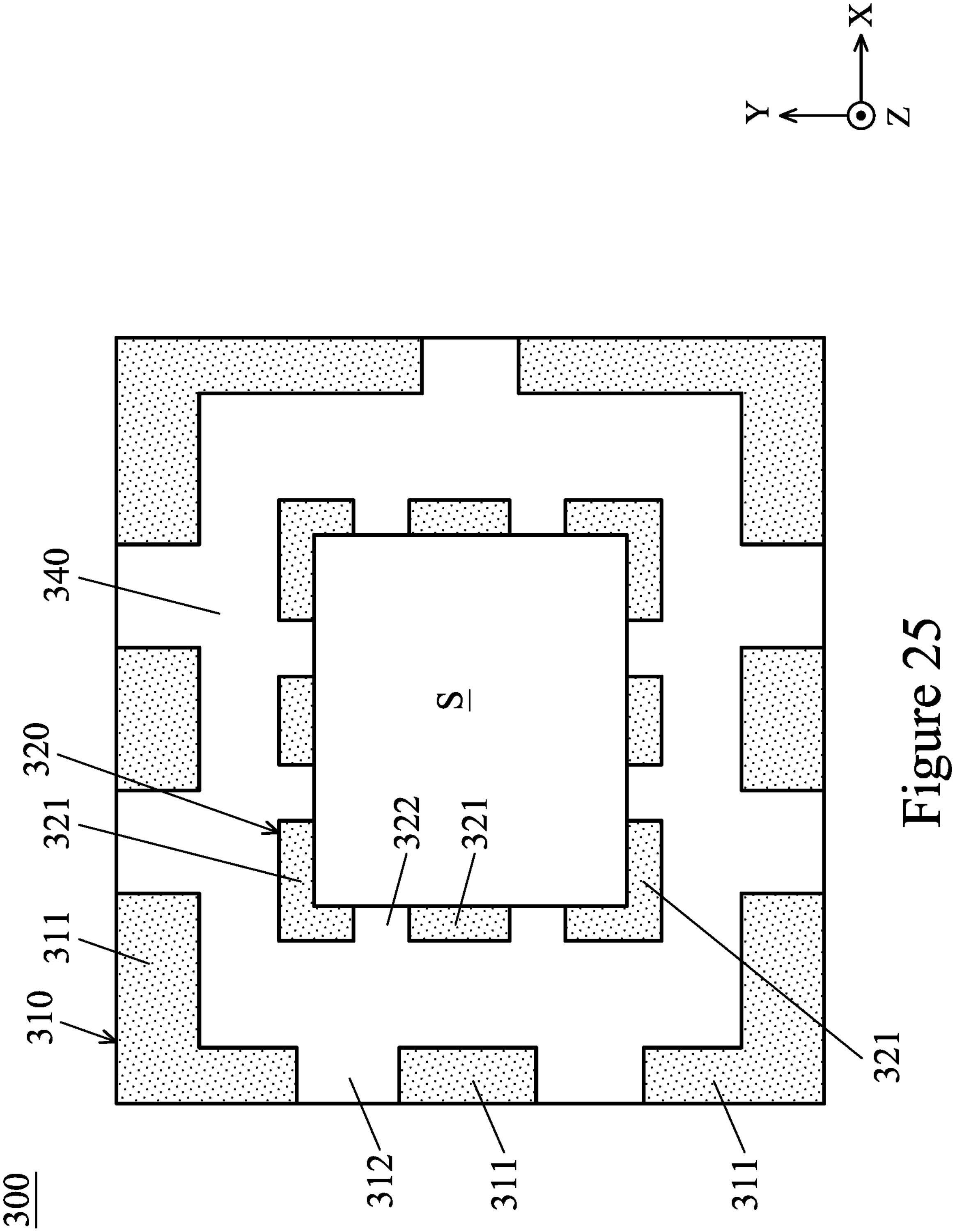

In FIG. 25, the opening 312 formed between the first segments 311 is substantially aligned with the opening 322 between the second segments 321. In some embodiments, the opening 312 overlaps with the opening 322 in the direction X or the direction Y. In the present embodiment, two openings 312 and two openings 322 are located on each side of the ring structure 300. Similarly, the arrangement of the openings 312 and 322 also helps to reduce the warpage of the package structure 10. It should be noted that the location or the number of the openings 312 and 322 are adjustable corresponding to the condition of each package structure 10.

Figure 26:
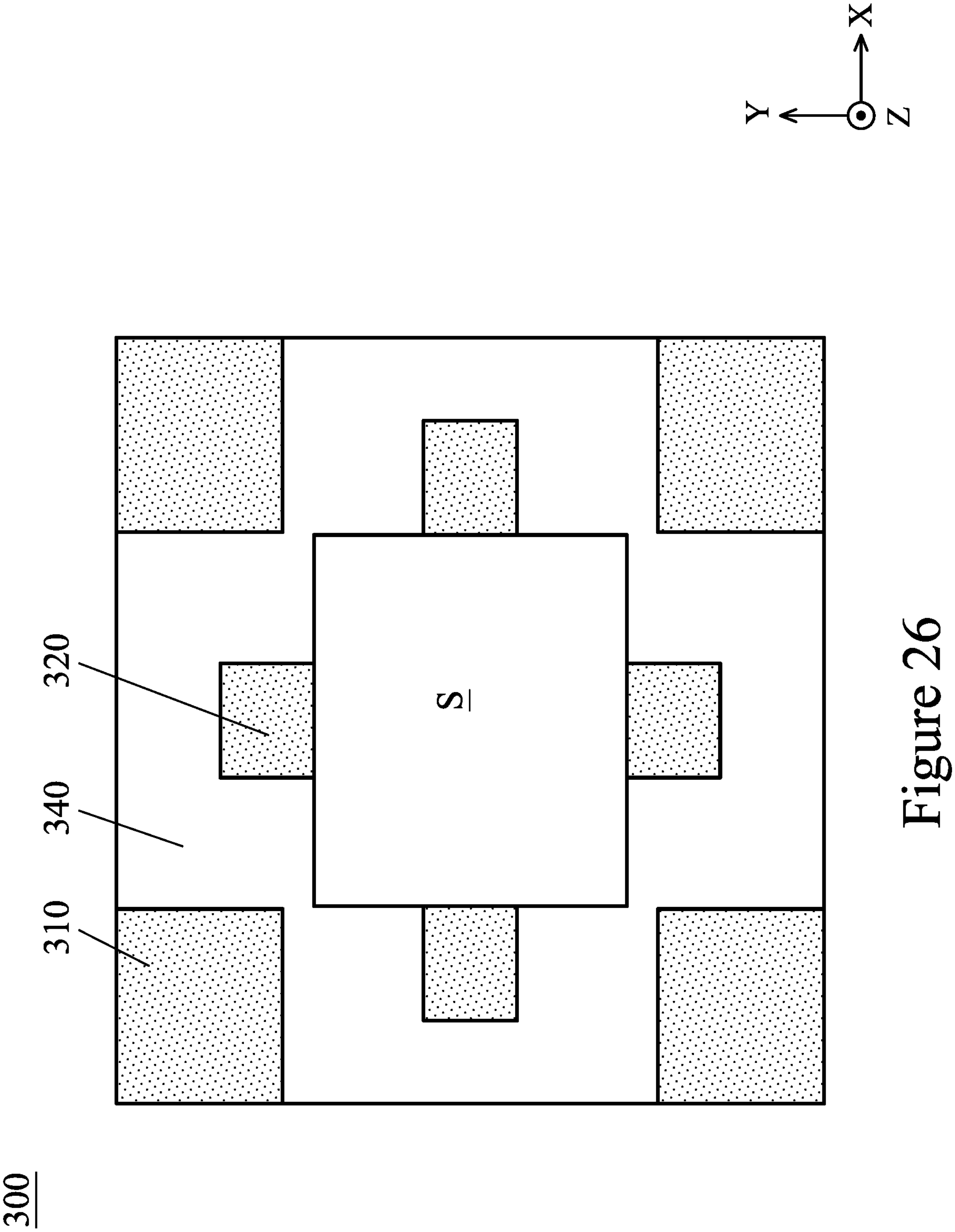

In FIG. 26, the first foot 310 includes a plurality of segments located at corners of the ring structure 300, and the second foot 320 includes a plurality of segments located in the middle of each side of the ring structure 300. In some embodiments, the second foot 320 is exposed from the first foot 310 on each side of the ring structure 300. Similarly, the arrangement of the first foot 310 and the second foot 320 also helps to reduce the warpage of the package structure 10. It should be noted that various embodiments of the ring structure 300 are discussed above, and these embodiments may be adjusted and/or combined based on the above description.

Embodiments of a package structure are provided. The packages structure includes a ring structure disposed on the substrate and covering the electronic component. The ring structure is configured to protect the electronic component. In addition, the ring structure includes multiple feet extending toward the substrate for reducing the warpage of the package structure. For example, the ring structure includes a first foot and a second foot which are located on a single side of the first package component. The footprints of the first foot and the second foot are controlled and adjusted in various forms to reduce the warpage of the package structure. In addition, the electronic component is contained in a recess between the first foot and the second foot for preventing damage. The electronic component is separated from the first foot and the second foot to make the assembly of the package structure easier. The top surface of the ring structure is substantially lower than the top surface of the first package component, and therefore reducing the possibility that the ring structure interferes with the thermal-dissipation of the first package component.

In some embodiments, a package structure is provided. The package structure includes a first package component and a second package component. The second package component includes a substrate and the first package component is mounted to the substrate. The package structure includes a ring structure disposed on the second package component and around the first package component. The ring structure has a first foot and a second foot parallel to the first foot. The width of the first foot is greater than the width of the second foot.

In some embodiments, a package structure is provided. The package structure includes a first package component and a second package component. The second package component includes a substrate, and the first package component is mounted to the substrate. The package structure also includes a ring structure disposed on the second package component and around the first package component. The ring structure has a first foot, a second foot, and a body connected to the first foot and the second foot. The first foot and the second foot extend toward the substrate, and a recess is formed between the first foot and the second foot for containing an electronic component. The center axis of the body and the center axis of the electronic component are spaced for a non-zero distance.

In some embodiments, a package structure is provided. The package structure includes a first package component and a second package component. The second package component includes a substrate, and the first package component is mounted to the substrate. The package structure also includes an electronic component bonded to the substrate. The package structure also includes a ring structure disposed on the second package component and around the first package component. The ring structure has a first foot, a second foot, and a body connected to the first foot and the second foot, and the first foot and the second foot extend toward the substrate. The first foot includes a plurality of first segments, the second foot includes a plurality of second segments, the electronic component is located between one of the first segments and one of the second segments, and the one of the first segments faces the one of the second segments.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:

a first package component;

a second package component comprising a substrate, wherein the first package component is mounted to the substrate; and a ring structure disposed on the second package component and around the first package component, wherein the ring structure has a first foot and a second foot parallel to the first foot, and a body connected to the first foot and the second foot, wherein a top surface of the body is lower than a top surface of the first package component, wherein a width of the first foot is greater than a width of the second foot.

2. The package structure as claimed in claim 1, wherein a width of the body is greater than a sum of the width of the first foot and the width of the second foot.

3. The package structure as claimed in claim 2, wherein the ring structure further has a third foot disposed between the first foot and the second foot, and the width of the body is greater than a sum of the width of the first foot, the width of the second foot, and a width of the third foot.

4. The package structure as claimed in claim 1, wherein the first foot comprises a plurality of first segments arranged to have a rectangular profile.

5. The package structure as claimed in claim 1, wherein the first package component is exposed from an opening of the ring structure, the opening is located inside the second foot.

6. The package structure as claimed in claim 1, further comprising a thermal-dissipation device over the top surface of the first package component and a top surface of the ring structure, and the top surface of the first package component is substantially level with the top surface of the ring structure.

7. The package structure as claimed in claim 6, wherein the thermal-dissipation device is attached to a thermal interface material on the top surface of the first package component and an adhesive on the top surface of the ring structure.

8. A package structure, comprising:

a first package component;

a second package component comprising a substrate, wherein the first package component is mounted to the substrate; and a ring structure disposed on the second package component and around the first package component, wherein the ring structure has a first foot, a second foot, and a body connected to the first foot and the second foot, the first foot and the second foot extend toward the substrate, and a recess is formed between the first foot and the second foot for containing an electronic component, wherein a center axis of the body and a center axis of the electronic component are parallel to each other and spaced for a non-zero distance.

9. The package structure as claimed in claim 8, wherein the electronic component is surrounded by a space formed by the ring structure and the substrate.

10. The package structure as claimed in claim 9, wherein the electronic component is spaced apart from the first foot, the second foot, and the body.

11. The package structure as claimed in claim 8, wherein the center axis of the electronic component is closer to the first package component than the center axis of the body.

12. The package structure as claimed in claim 8, wherein the center axis of the body and the center axis of the electronic component are perpendicular to a top surface of the substrate.

13. A package structure, comprising:

a first package component;

a second package component comprising a substrate, wherein the first package component is mounted to the substrate;

an electronic component bonded to the substrate; and a ring structure disposed on the second package component and around the first package component, wherein the ring structure has a first foot, a second foot, and a body connected to the first foot and the second foot, the first foot and the second foot extend toward the substrate, and a top surface of the body is lower than a top surface of the first package component, wherein the first foot comprises a plurality of first segments, the second foot comprises a plurality of second segments, the electronic component is located between one of the first segments and one of the second segments, and the one of the first segments faces the one of the second segments.

14. The package structure as claimed in claim 13, wherein a gap between the first segments faces a gap between the second segments, and a straight line passes through the gap between the first segments and the gap between the second segments.

15. The package structure as claimed in claim 14, wherein the ring structure is symmetrically arranged about the straight line.

16. The package structure as claimed in claim 14, wherein the gap between the first segments is wider than the gap between the second segments.

17. The package structure as claimed in claim 14, wherein the straight line is parallel to a top surface of the substrate.

18. The package structure as claimed in claim 13, wherein one of the second segments is located at a middle of adjacent two of the first segments on one side of the ring structure.

19. The package structure as claimed in claim 13, wherein a width of the first foot is greater than a width of the second foot, and the first foot and the second foot are located on opposite edges of the ring structure.

20. The package structure as claimed in claim 13, wherein a center axis of the body and a center axis of the electronic component are spaced for a non-zero distance.

* * * * *